US012777915B2

(12) United States Patent
Chan et al.

(10) Patent No.: US 12,777,915 B2
(45) Date of Patent: Oct. 27, 2026

(54) METHODS OF FORMING SEMICONDUCTOR DEVICES INCLUDING A CAPACITOR AND FRONT AND BACKSIDE INTERCONNECT STRUCTURES

(71) Applicant: Taiwan Semiconductor Manufacturing Company, Ltd., Hsinchu (TW)

(72) Inventors: Chao-Kai Chan, Taichung City (TW); Chung-Hao Tsai, Changhua County (TW); Chuei-Tang Wang, Taichung City (TW); Wei-Ting Chen, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 643 days.

(21) Appl. No.: 18/186,206

(22) Filed: Mar. 20, 2023

(65) Prior Publication Data

US 2024/0088033 A1 Mar. 14, 2024

Related U.S. Application Data

(60) Provisional application No. 63/405,886, filed on Sep. 13, 2022.

(51) Int. Cl.
*H10W 20/41* (2026.01)
*H10D 1/66* (2025.01)
(Continued)

(52) U.S. Cl.
CPC .......... *H10W 20/435* (2026.01); *H10D 1/665* (2025.01); *H10D 30/6735* (2025.01); *H10D 62/121* (2025.01); *H10D 84/0128* (2025.01); *H10D 84/0149* (2025.01); *H10D 84/038* (2025.01); *H10W 20/42* (2026.01)

(58) Field of Classification Search
CPC ............ H01L 23/5283; H01L 23/5226; H01L 23/481; H01L 23/5223; H01L 21/76898; H10D 1/665; H10D 30/6735; H10D 62/121; H10D 84/0128; H10D 84/0149; H10D 84/038; H10D 1/68; H10D 30/014;
(Continued)

(56) References Cited

U.S. PATENT DOCUMENTS

| | | | | |
|---|---|---|---|---|
| 10,276,476 | B1 * | 4/2019 | Li | H10D 30/6755 |
| 2004/0002188 | A1 * | 1/2004 | Chung | H10D 1/692 257/E21.011 |

(Continued)

*Primary Examiner* — Norman D Richards
*Assistant Examiner* — Ethan Edward Cutler
(74) *Attorney, Agent, or Firm* — JCIPRNET

(57) ABSTRACT

A method of forming a semiconductor device is provided. A transistor is formed at a first side of the substrate and a first dielectric layer is formed aside the transistor. A first metal via is formed through the first dielectric layer and aside the transistor. A first interconnect structure is formed over the first side of the substrate and electrically connected to the transistor and the first metal via. The substrate is thinned from a second side of the substrate. A capacitor is formed at the second side of the substrate and a second dielectric layer is formed aside the capacitor. A second metal via is formed through the second dielectric layer and the substrate and electrically connected to the first metal via.

20 Claims, 35 Drawing Sheets

(51) Int. Cl.

| | |
|---|---|
| ***H10D 30/67*** | (2025.01) |
| ***H10D 62/10*** | (2025.01) |
| ***H10D 84/01*** | (2026.01) |
| ***H10D 84/03*** | (2025.01) |
| ***H10W 20/42*** | (2026.01) |

(58) Field of Classification Search

CPC .. H10D 30/43; H10D 30/6757; H10D 84/811; H10D 88/01; H10D 88/101

See application file for complete search history.

(56) References Cited

U.S. PATENT DOCUMENTS

| | | | | |
|---|---|---|---|---|
| 2007/0063244 | A1* | 3/2007 | Ho | H10B 12/0387<br>438/386 |
| 2020/0381398 | A1* | 12/2020 | Lan | H10D 84/0165 |
| 2022/0246682 | A1* | 8/2022 | Sekar | H10D 86/01 |

* cited by examiner

METHODS OF FORMING SEMICONDUCTOR DEVICES INCLUDING A CAPACITOR AND FRONT AND BACKSIDE INTERCONNECT STRUCTURES

CROSS-REFERENCE TO RELATED APPLICATION

This application claims the priority benefit of U.S. provisional application Ser. No. 63/405,886, filed on Sep. 13, 2022. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Although the existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
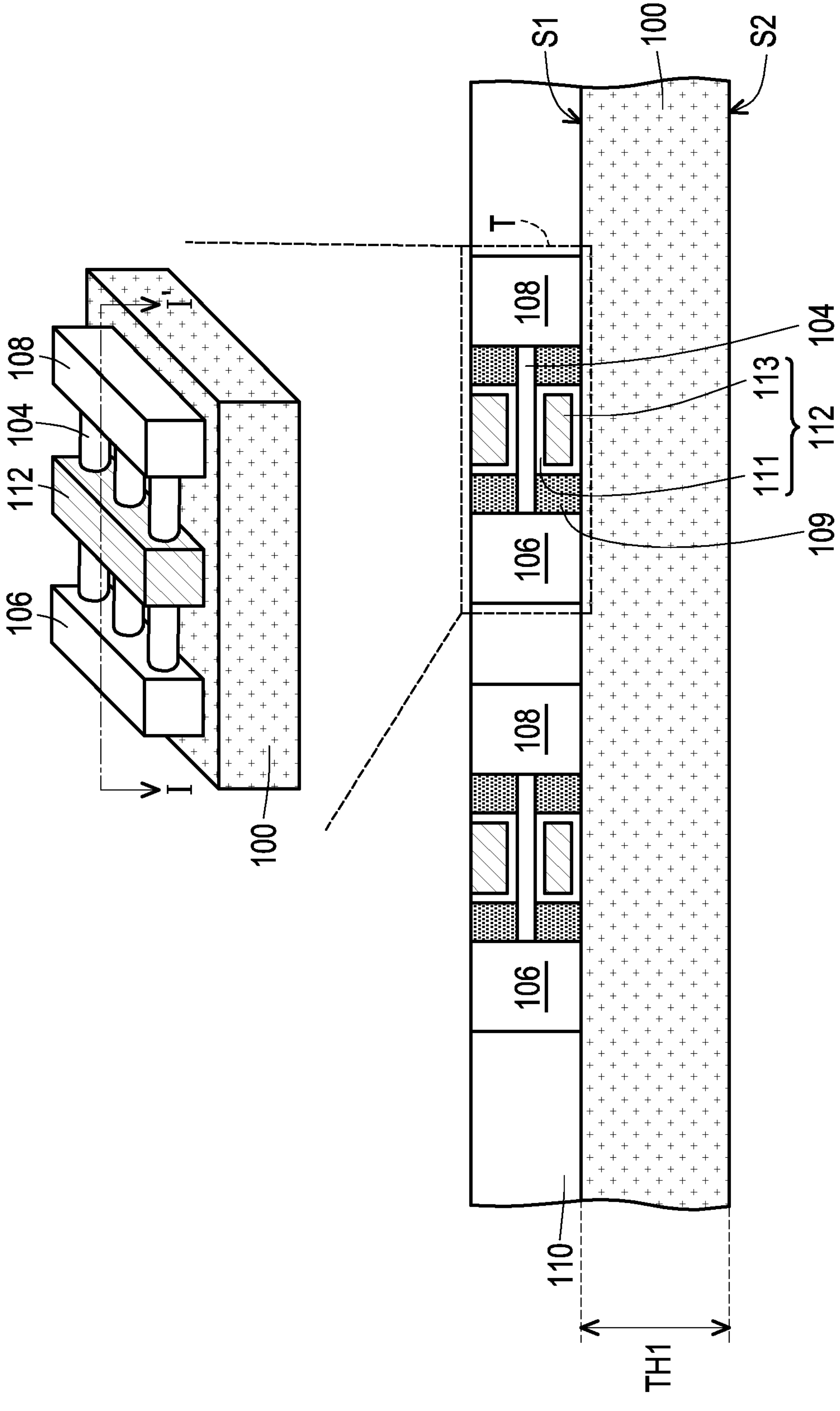
FIG. 1A to FIG. 1I illustrate cross-sectional views of a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

The present disclosure is directed to semiconductor devices and forming methods thereof. The conventional MIM capacitor is disposed within a back-end-of-the-line (BEOL) structure, and such MIM capacitor exhibits low performance due to long electrical path and routing in the BEOL structure. However, in the present disclosure, a capacitor (e.g., planar MIM capacitor or trench-type MIM capacitor) and a transistor are disposed at opposite sides of a thin substrate and connected to each other through vertical power rails, so as to significantly shorten the electrical path and routing, and greatly improve the power integrity of the semiconductor device.

FIG. 1A to FIG. 1I illustrate cross-sectional views of a method of forming a semiconductor device in accordance with some embodiments of the present disclosure. It is understood that the disclosure is not limited by the method described below. Additional operations can be provided before, during, and/or after the method and some of the operations described below can be replaced or eliminated, for additional embodiments of the methods. Although FIG. 1A to FIG. 1I are described in relation to a method, it is appreciated that the structures disclosed in FIG. 1A to FIG. 1I are not limited to such a method, but instead may stand alone as structures independent of the method.

Referring to FIG. 1A, a substrate 100 is provided. The substrate 100 may be a semiconductor substrate such as a silicon substrate. The substrate 100 is hundreds of micron-scale. In some embodiments, the substrate 100 has a thickness TH1 of greater than about 700 um. The substrate has a first side S1 and a second side S2 opposite to the first side S1. In some embodiments, the first side S1 is a front side or an active side, and the second side S2 is a front side or an inactive side. However, the disclosure is not limited thereto. In other embodiments, the first side S1 is a back side, and the second side S2 is a front side. In some embodiments, isolation structures such has shallow trench isolation (STI) structures (not shown in this cross section) are formed in the upper portion of the substrate 100 to define active regions.

Suitable doped semiconductor wells, such as p-type wells and n-type wells, may be formed within the active regions.

Transistors T may be formed at the first side S1 of the substrate 100. In some embodiments, each of the transistors T is a gate-all-around (GAA) transistor formed on the first side S1 of the substrate 100. In some embodiment, each of the transistors T includes semiconductor nanowires 104 as channels suspended by strained regions 106 and 108, and a gate structure 112 surrounding the nanowires 104 and located between the strained regions 106 and 108, as shown in the simplified perspective view in FIG. 1. The strained regions 106 and 108 are referred to as "source/drain regions" in some examples. Source/drain region(s) may refer to a source or a drain, individually or collectively dependent upon the context. In some embodiments, the strained regions 106 are drain contacts, and the strained regions 108 are source contacts, but the disclosure is not limited thereto. In other embodiments, the strained regions 106 are source contacts, and the strained regions 108 are drain contacts. For an n-type transistor, the strained regions 106 and 108 may be doped SiC epitaxial layers, and for a p-type transistor, the strained regions 106 and 108 may be doped SiGe epitaxial layers. In some embodiments, the gate structure 112 may include a gate electrode 113 and a gate dielectric layer 111 surrounding the gate electrode 113. In some embodiments, the lower gate dielectric layer 111 has a ring-shaped cross-section, and the upper gate dielectric layer 111 has a U-shaped cross-section. In some embodiments, the gate dielectric layer 111 includes at least one dielectric material, such as a high-k material. Examples of the high-k material include metal oxide, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, the like, or a combination thereof. The high-k material has a dielectric constant greater than 10, greater than 20, or even more. In some embodiments, the gate electrode 113 includes a work function layer and a metal filling layer. For an n-type transistor, one or more of TaN, TaAlC, TiN, TiC, Co, TiAl, HfTi, TiSi and TaSi is used as the work function layer, and for a p-type transistor, one or more of TiAlC, Al, TiAl, TaN, TaAlC, TiN, TiC and Co is used as the work function layer. The metal filling layer may include Cu, Al, Ti, Ta, W, Ru, Co, Ni, the like, or a combination thereof. In some embodiments, inner spacers 109 may be formed between the gate structure 112 and each of the strained regions 106 and 108. The inner spacers 109 may include silicon oxide, silicon nitride, silicon carbide, silicon carbide nitride, silicon oxide carbide, silicon carbide oxynitride, the like, or a combination thereof.

In some embodiments, a dielectric layer 110 is formed aside the transistors T. The dielectric layer 110 includes a contact etch stop layer (CESL) and an interlayer dielectric (ILD) layer with different materials. The CESL may include silicon nitride, silicon oxynitride, silicon nitride with oxygen (O) or carbon (C) elements, metal oxide such as $Al_2O_3$, the like, or a combination thereof. The ILD layer may include silicon oxide, silicon oxynitride, silicon nitride, a low low-k material having a dielectric constant less than 3.5, the like, or a combination thereof. The dielectric layer 110 may be a single layer or a multiple-layer structure.

In some embodiments, the gate structure 112 is a replacement gate structure. Specifically, the gate structure 112 may be formed by replacing dummy gate structure with metal gate structure after the dielectric layer 110 is formed.

Figure 1B:
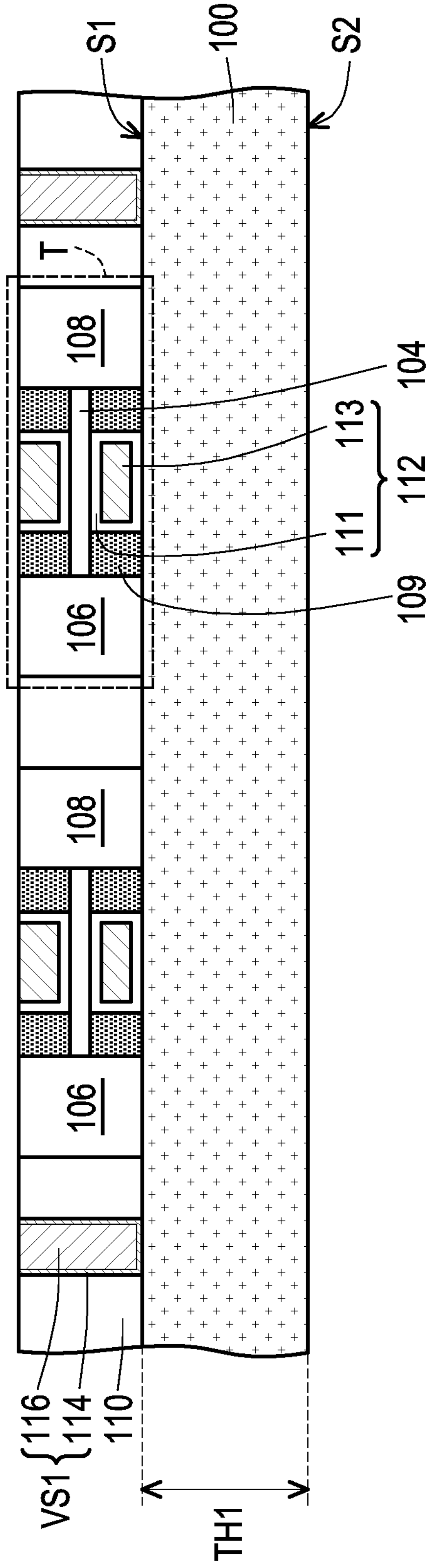

Referring to FIG. 1B, metal vias VS1 are formed in the dielectric layer 110 and located aside the transistors T. In some embodiments, via openings are formed through the dielectric layer 110 by photolithography and etching processes. Thereafter, a metal liner layer 114 and a metal layer 116 are formed on the dielectric layer 110 and filled in the via openings. In some embodiments, the metal liner layer 114 includes a seed layer and/or a barrier layer. The seed layer may include Ti/Cu. The barrier layer may include Ta, TaN, Ti, TiN, CoW or a combination thereof. The metal layer 116 may include Cu, Al, Ti, Ta, W, Ru, Co, Ni, the like, or a combination thereof. The metal liner layer 114 and the metal layer 116 may be formed by a sputtering process and/or an electroplating process. Excess materials outside of the via openings are removed by a planarization process, such as a chemical mechanical polishing (CMP) process. The remaining metal liner layer 114 and the remaining metal layer 116 constitute the metal vias VS1 in some examples. The metal vias VS1 are referred to as "front-side zeroth vias" or "front-side zeroth contact plugs" in some examples. In some embodiments, the top surfaces of the metal vias VS1 are substantially flushed with the top surface of the dielectric layer 110.

Figure 1C:
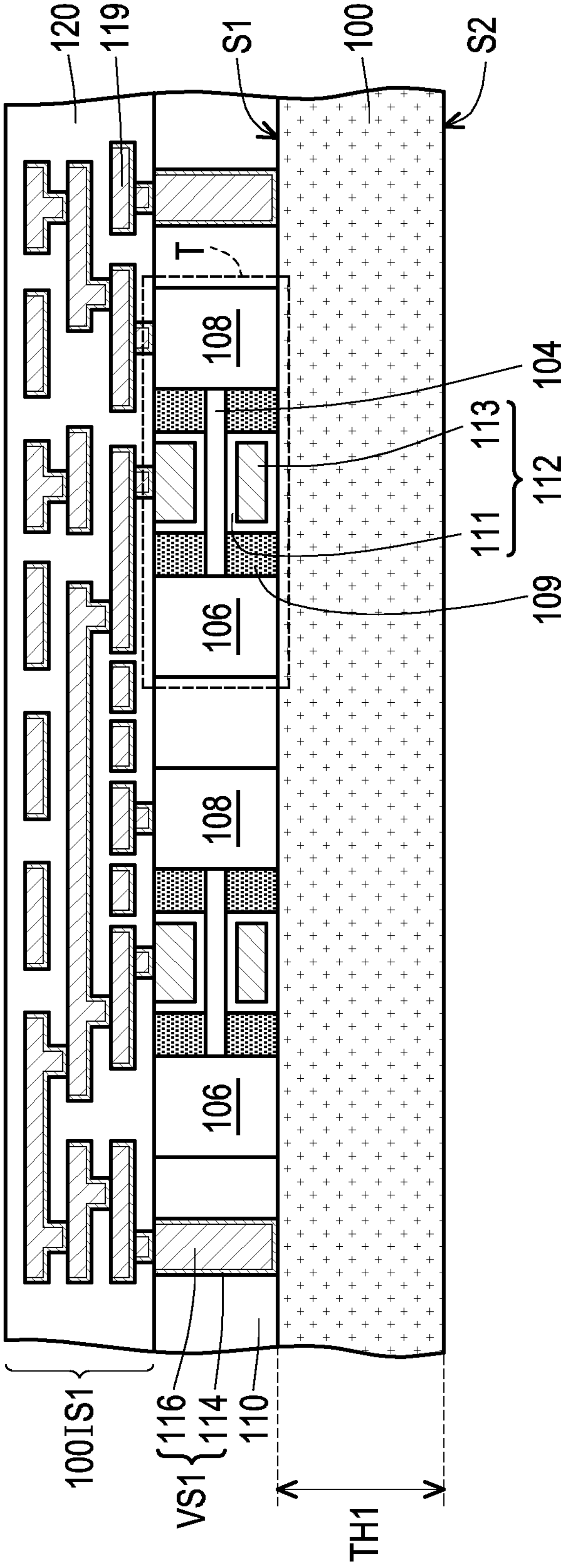

Referring to FIG. 1C, an interconnect structure 100IS1 is formed on the first side S1 of the substrate 100 and electrically connected to the transistors T and the metal vias VS1. The interconnect structure 100IS1 may include metal features 119 embedded by dielectric layers 120. The metal features 119 are disposed in the dielectric layers 120 and electrically connected with each other. The dielectric layers 120 may include etch stop layers and inter-metal dielectric (IMD) layers with different materials. The etch stop layers may include silicon nitride, silicon oxynitride, silicon nitride with oxygen (O) or carbon (C) elements, metal oxide such as $Al_2O_3$, the like, or a combination thereof. The IMD layers may include silicon oxide, silicon oxynitride, silicon nitride, a low low-k material having a dielectric constant less than 3.5, the like, or a combination thereof. The metal features 119 include metal lines, metal vias and/or metal pads. The metal vias are formed between and in contact with two metal lines. The metal features 119 may include Cu, Al, Ti, Ta, W, Ru, Co, Ni, the like, or a combination thereof. In some embodiments, a metal liner layer may be disposed between each metal feature 119 and the dielectric layer 120 to prevent the material of the metal feature 119 from migrating to the underlying component such as the transistor T. In some embodiments, the metal liner layer includes a seed layer and/or a barrier layer. The seed layer may include Ti/Cu. The barrier layer may include Ta, TaN, Ti, TiN, CoW or a combination thereof. In some embodiments, in the interconnect structure 100IS1, each of the lowermost metal via in contact with the transistor T and the lowermost metal line in contact with the lowermost metal via is formed by a single damascene process. In some embodiments, the upper metal via and the upper metal line of the interconnect structure 100IS1 are formed by a dual damascene process. For example, the upper metal line and the underlying metal via may be formed as an integrated line and via structure without an interface by a dual damascene process. In some embodiments, the metal vias VS1 are regarded as part of the interconnect structure 100IS1. The interconnect structure 100IS1 is referred to as a "front-side interconnect structure" or "BEOL structure" in some examples.

Figure 1D:
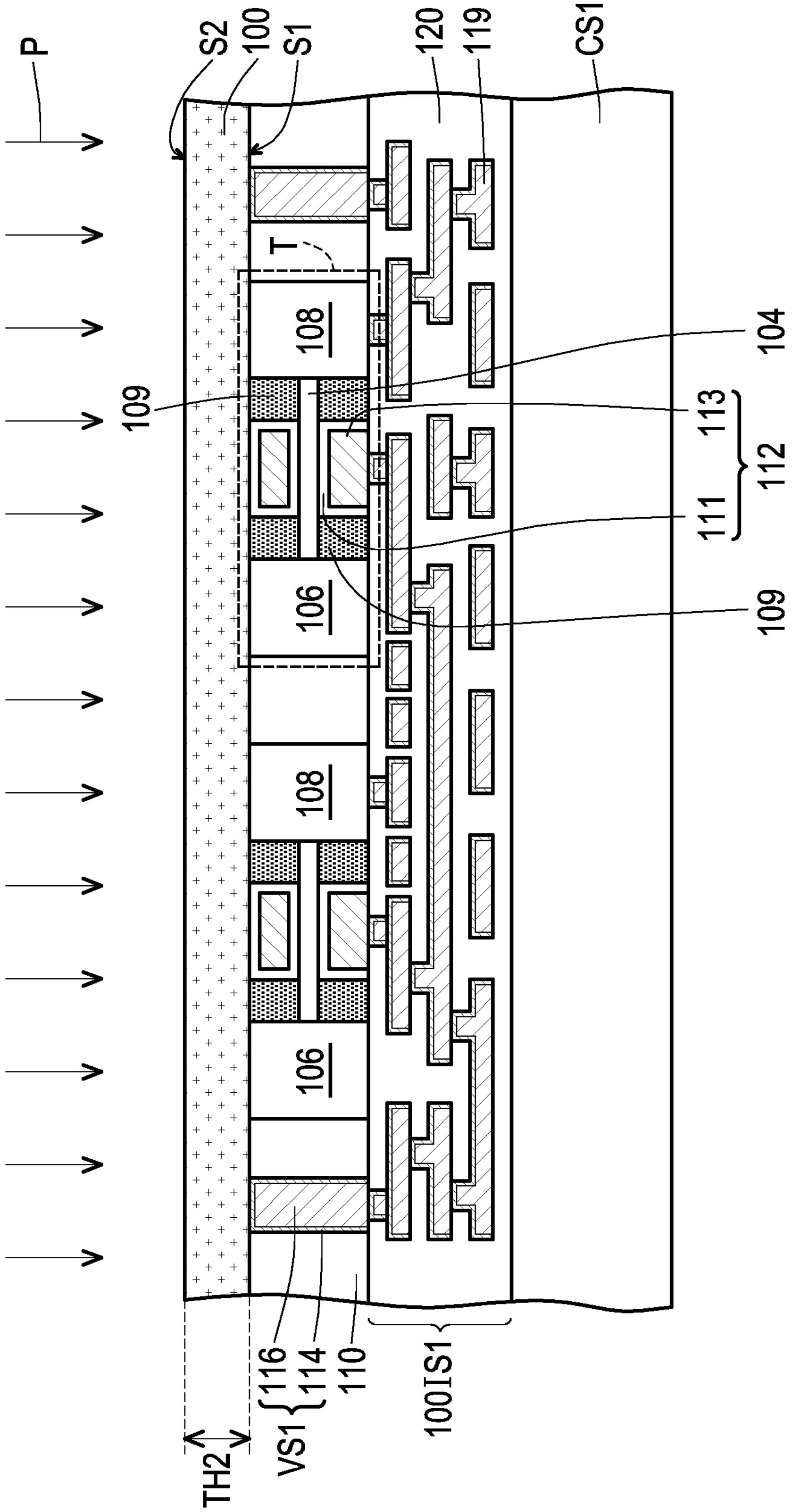

Referring to FIG. 1D, a thinning process P is performed to the second side S2 of the substrate 100, so as to reduce the thickness of the substrate 100. In some embodiments, a carrier CS1 is bonded to the interconnect structure 100IS1 and the whole structure is then turned over, so the second side S2 of the substrate 100 faces up. The carrier CS1 may be a glass carrier, a silicon wafer or the like. In some embodiments, the carrier CS1 is bonded to the interconnect structure 100IS1 through an adhesive layer such as an Ultra-Violet (UV) glue, a Light-to-Heat Conversion (LTHC) glue, a die attach tape (DAF), or the like, although other types of adhesives may be used. Thereafter, the thinning process P is performed to the second side S2 of the substrate 100, so as to thin the substrate 100 to the desired thickness. In some embodiments, the thickness TH2 of the thinned substrate 100 ranges from about 0.01 um to 0.1 um. The thinning process P may include a grinding process, a polishing process, the like or a combination thereof.

Figure 1E:
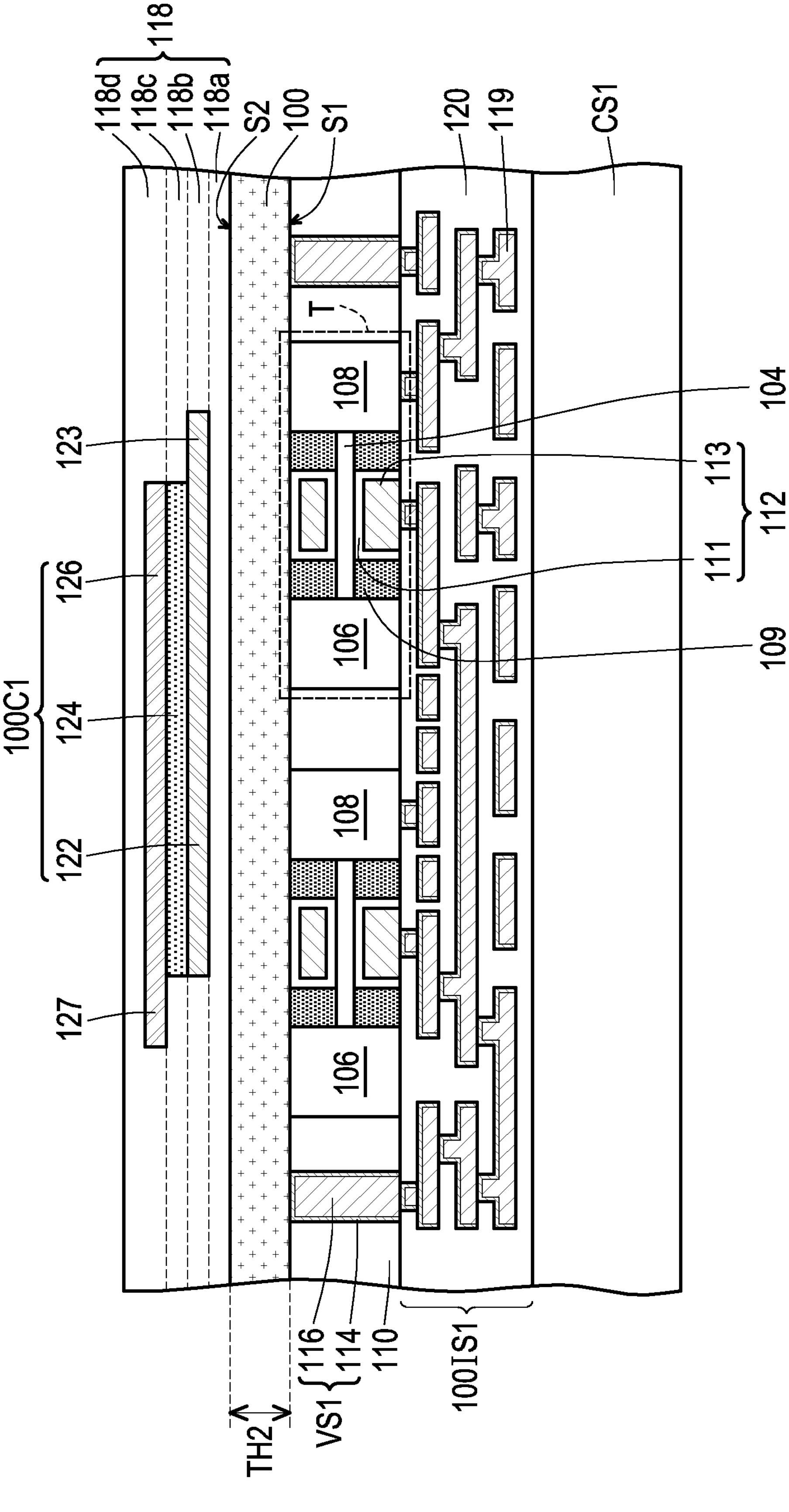

Referring to FIG. 1E, a capacitor 100C is formed over the second side S2 of the substrate 100 and embedded by dielectric layers 118. In some embodiments, the capacitor 100C is a planar metal-insulator-metal (MIM) capacitor including a bottom metal electrode 122, a top metal electrode 126 and a capacitor dielectric layer 124 formed between the bottom metal electrode 122 and the top metal electrode 126. The method of forming the capacitor 100C includes performing multiple depositing processes and patterning processes (e.g., photolithography and etching processes) alternatively. Accordingly, the bottom metal electrode 122, the capacitor dielectric layer 124 and the top metal electrode 126 are formed sequentially on the second side S2 of the substrate 100. The bottom metal electrode 122 is separated to the second side S2 of the substrate 100 by a dielectric layer 118*a* and embedded by a dielectric layer 118*b*. The capacitor dielectric layer 124 is disposed on the bottom metal electrode 122 and embedded by a dielectric layer 118*c*. The top metal electrode layer 126 is disposed on the capacitor dielectric layer 124 and embedded by a dielectric layer 118*d*. The dielectric layers 118*a* to 118*d* are collectively referred to as dielectric layers 118. Each of the bottom metal electrode 122 and the top metal electrode 126 may include a titanium (Ti) layer, a titanium nitride (TiN) layer, a tantalum (Ta) layer, a tantalum nitride (TaN) layer, the like, or a combination thereof. The capacitor dielectric layer 124 may include a nitride layer, a silicon nitride layer, or a high-k dielectric layer having a dielectric constant greater than 4. Exemplary high-k layer may include hafnium dioxide, hafnium silicate, zirconium silicate, zirconium dioxide, the like, or a combination thereof. The capacitor dielectric layer 124 may be a single-layer or a multi-layer structure. The thickness of each of the bottom metal electrode 122, a capacitor dielectric layer 124 and a top metal electrode 126 may range from about 0.05 um to 0.15 um. In some embodiments, the capacitance of the capacitor 100C ranges from about $10^{-9}$ F to $10^{-6}$ F. In some embodiments, the bottom metal electrode 122 has an extending portion 123 not covered by (or misaligned with) the top metal electrode 126 and the capacitor dielectric layer 124. In some embodiments, the top metal electrode 126 includes an extending portion 127 misaligned with the underlying the capacitor dielectric layer 124 and the bottom metal electrode 122. In some embodiments, one sidewall of the capacitor dielectric layer 124 is aligned with the sidewall of the bottom metal electrode 122, and the opposite sidewall of the capacitor dielectric layer 124 is aligned with the sidewall of the top metal electrode 126.

The dielectric layers 118 may include inter-metal dielectric (IMD) layers. The IMD layers may include silicon oxide, silicon oxynitride, silicon nitride, a low low-k material having a dielectric constant less than 3.5, the like, or a combination thereof. The dielectric layers 118 and the capacitor dielectric layer 124 may include different materials. The topmost dielectric layer 118*d* covers the top and sidewall of the top metal electrode layer 126.

Figure 1F:
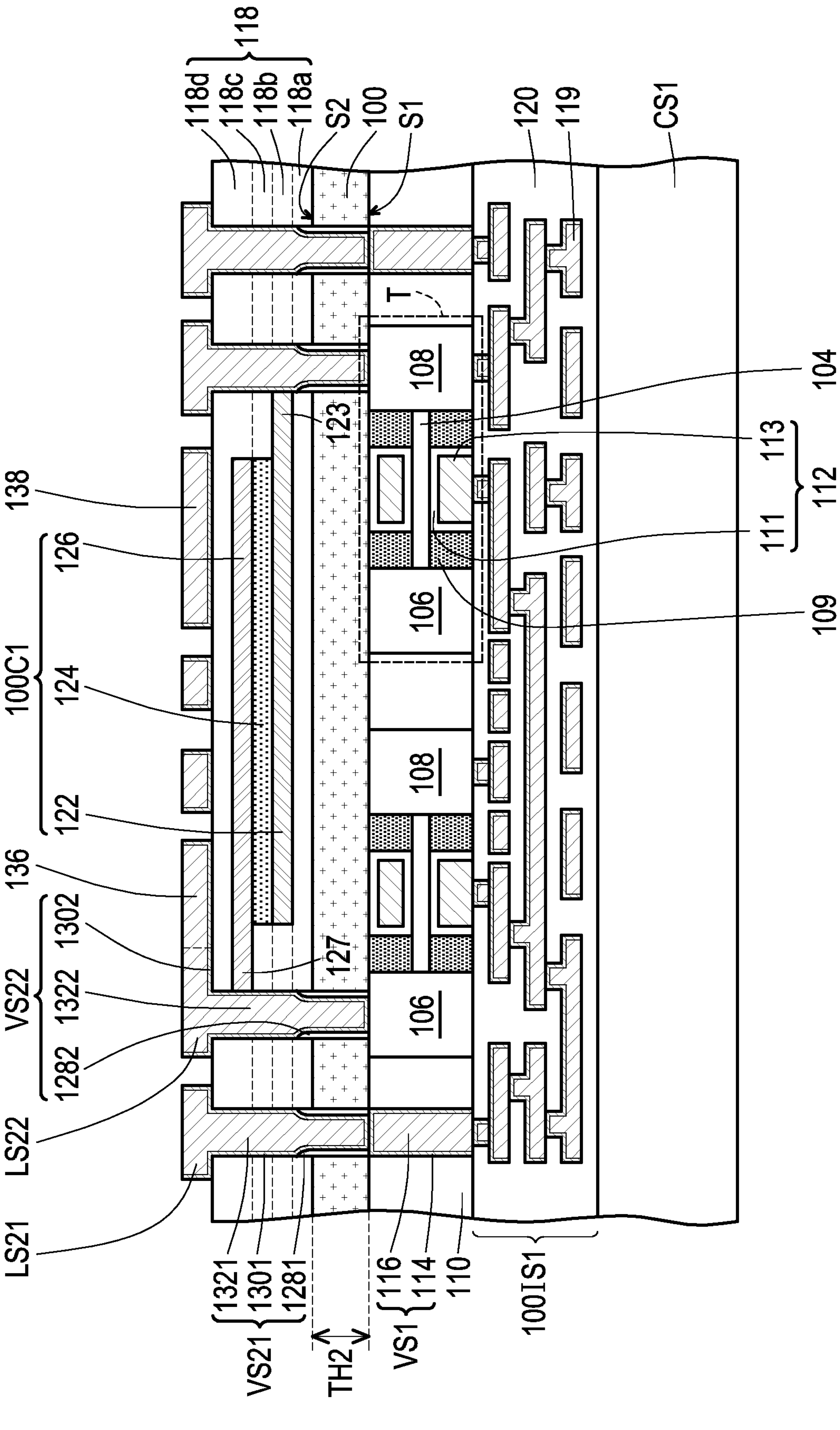

Referring to FIG. 1F, metal vias VS21 are formed in the dielectric layer 118 and the substrate 100 and landed on the metal vias VS1. In some embodiments, via openings are formed through the dielectric layer 118 and the substrate 100 by photolithography and etching processes. Thereafter, an insulator liner layer 1281 is formed on the sidewalls and bottoms of the via openings. The insulator liner layer 1281 may include silicon oxide, silicon oxynitride, or the like. An anisotropic etching process is then performed to remove the bottom portions and upper sidewall portions of the insulator liner layer, so the remaining insulator liner layer 1281 is formed on the lower sidewalls of the via openings. In some embodiments, the top surface of the insulator liner layer 1281 is higher than the second side S2 of the substrate 100 but lower than the bottom surface of the bottom metal electrode 122. However, the disclosure is not limited thereto. In other embodiments, the top surface of the insulator liner layer 1281 is substantially flushed with the top surface of the dielectric layer 118*d*, as shown in FIG. 1I.

In some embodiments, a metal line LS21 and the underlying metal via VS21 may be formed in the same process operation. For example, a metal liner layer 1301 and a metal layer 1321 are formed as an integrated line and via structure without an interface by a dual damascene process. The metal liner layer 1301 may include a seed layer and/or a barrier layer. The seed layer may include Ti/Cu. The barrier layer may include Ta, TaN, Ti, TiN, CoW or a combination thereof. The metal layer 1321 may include Cu, Al, Ti, Ta, W, Ru, Co, Ni, the like, or a combination thereof. The metal liner layer 1301, the metal layer 1321 and the insulator liner layer 1281 constitute the metal vias VS21 in some examples.

In some embodiments, during the operation of forming metal vias VS21, metal vias VS22 are simultaneously formed in the dielectric layer 118 and the substrate 100 and landed on the strained regions 106 and 108. In some embodiments, via openings are formed through the dielectric layer 118 and the substrate 100 by photolithography and etching processes. In some embodiments, the via openings are formed to expose the sidewalls of the metal electrodes 126 and 122. In other embodiments, the via openings are formed to penetrate through the metal electrodes 126 and 122. Thereafter, an insulator liner layer 1282 is formed on the lower sidewalls of the via openings. The insulator liner layer 1282 may include silicon oxide, silicon oxynitride, or the like. In some embodiments, the top surface of the insulator liner layer 1282 is higher than the second side S2 of the substrate 100 but lower than the bottom surface of the bottom metal electrode 122. However, the disclosure is not limited thereto. In other embodiments, the top surface of the insulator liner layer 1282 is substantially flushed with the top surface of the dielectric layer 118*d*, as shown in FIG. 1I.

In some embodiments, a metal line LS22 and the underlying metal via VS22 may be formed in the same process operation. For example, a metal liner layer 1302 and a metal layer 1322 are formed as an integrated line and via structure without an interface by a dual damascene process. The metal liner layer 1302 may include a seed layer and/or a barrier layer. The seed layer may include Ti/Cu. The barrier layer may include Ta, TaN, Ti, TiN, CoW or a combination thereof. The metal layer 1322 may include Cu, Al, Ti, Ta, W, Ru, Co, Ni, the like, or a combination thereof. The metal liner layer 1302, the metal layer 1322 and the insulator liner layer 1282 constitute the metal vias VS22 in some examples. In some embodiments, one of the metal vias VS22 (e.g., right metal via VS22 in FIG. 1F is connected to (or in physical contact to) the bottom metal electrode 122, and another of the metal vias VS22 (e.g., left metal via VS22 in FIG. 1F) is connected to (or in physical contact to) the top metal electrode 126. The metal vias VS21 and VS22 are referred to as "back-side zeroth vias" or "vertical power rails" in some examples. The metal vias VS21 and VS1 are collectively referred to as "vertical power rails" in some examples. The metal vias VS22 are referred to as "source and drain vias" in some examples.

In some embodiments, during the operation of forming metal lines LS21 and LS22, and the metal vias VS21 and VS22, other metal features 136 and 138 such as integrated line and via structures are simultaneously formed above the capacitor 100C1. In some embodiments, vias of the integrated line and via structures 136 and 138 are not shown in this cross-section and not landed on the capacitor 100C1.

Figure 1G:
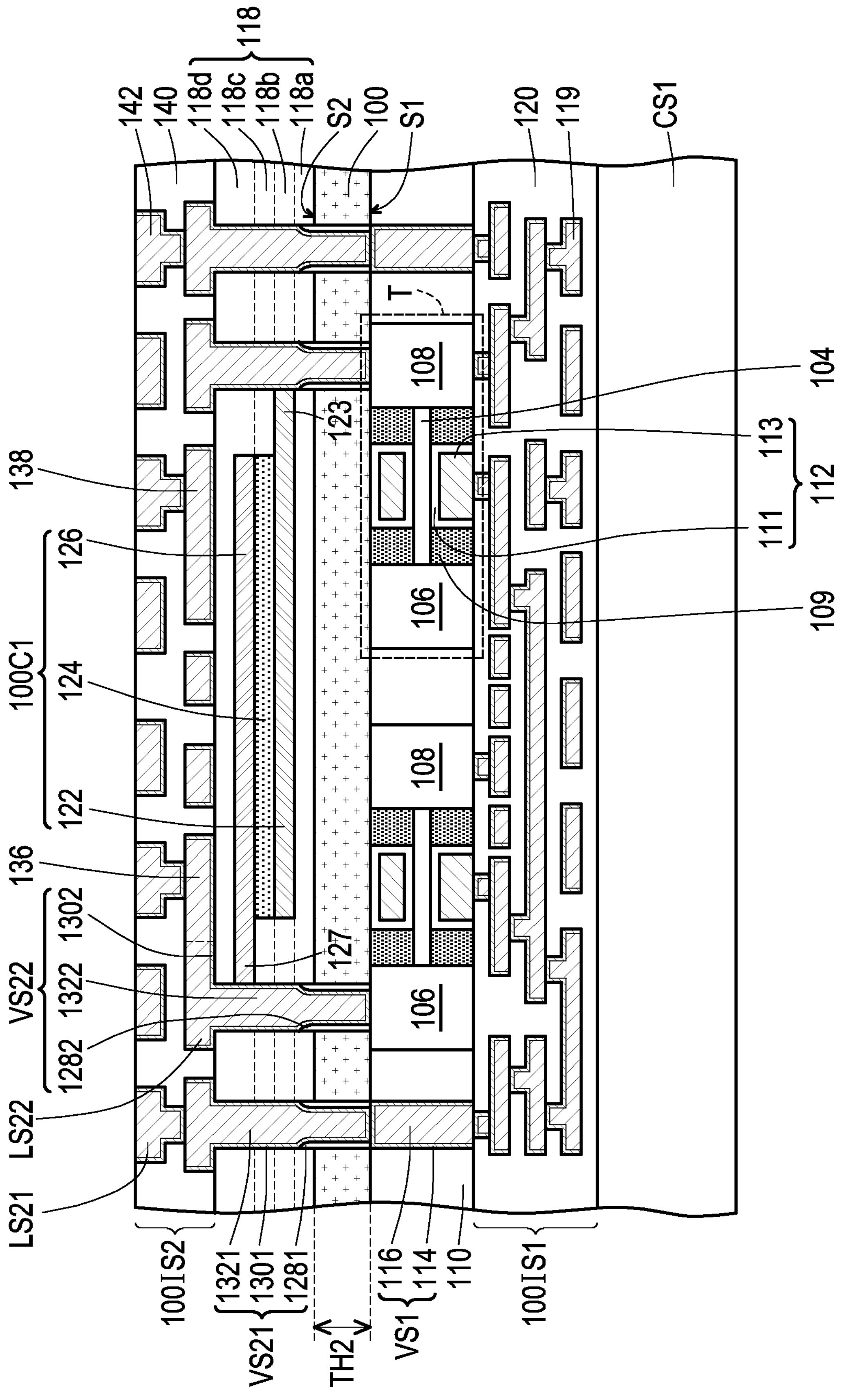

Referring to FIG. 1G, an interconnect structure 100IS2 is formed on the second side S2 of the substrate 100 and electrically connected to the transistors T and the metal vias VS21 and VS22. The interconnect structure 100IS2 may include metal features 142 embedded by dielectric layers 140. The metal features 142 are disposed in the dielectric layers 140 and electrically connected with each other. The dielectric layers 140 may include etch stop layers and inter-metal dielectric (IMD) layers with different materials. The etch stop layers may include silicon nitride, silicon oxynitride, silicon nitride with oxygen (O) or carbon (C) elements, metal oxide such as $Al_2O_3$, the like, or a combination thereof. The IMD layers may include silicon oxide, silicon oxynitride, silicon nitride, a low low-k material having a dielectric constant less than 3.5, the like, or a combination thereof. The metal features 142 include metal lines, metal vias and/or metal pads. The metal vias are formed between and in contact with two metal lines. The metal features 142 may include Cu, Al, Ti, Ta, W, Ru, Co, Ni, the like, or a combination thereof. In some embodiments, a metal liner layer may be disposed between each metal feature 142 and the dielectric layer 140 to prevent the material of the metal feature 142 from migrating to the underlying components such as the transistor T and the capacitor 100C1. In some embodiments, the metal liner layer includes a seed layer and/or a barrier layer. The seed layer may include Ti/Cu. The barrier layer may include Ta, TaN, Ti, TiN, CoW or a combination thereof. In some embodiments, the interconnect structure 100IS2 is formed by a dual damascene process. For example, a metal line and the underlying metal via may be formed as an integrated line and via structure without an interface by a dual damascene process. In some embodiments, the metal vias VS21 and VS22, the metal lines LS21 and LS22, and other metal features 136 and 138 are regarded as part of the interconnect structure 100IS2. The interconnect structure 100IS2 is referred to as "back-side interconnect structure" in some examples. In some embodiments, the critical dimension of metal features (e.g., line width or via size) of the interconnect structure 100IS2 is different from (e.g., greater than) the critical dimension of metal features (e.g., line width or via size) of the interconnect structure 100IS1.

Figure 1H:
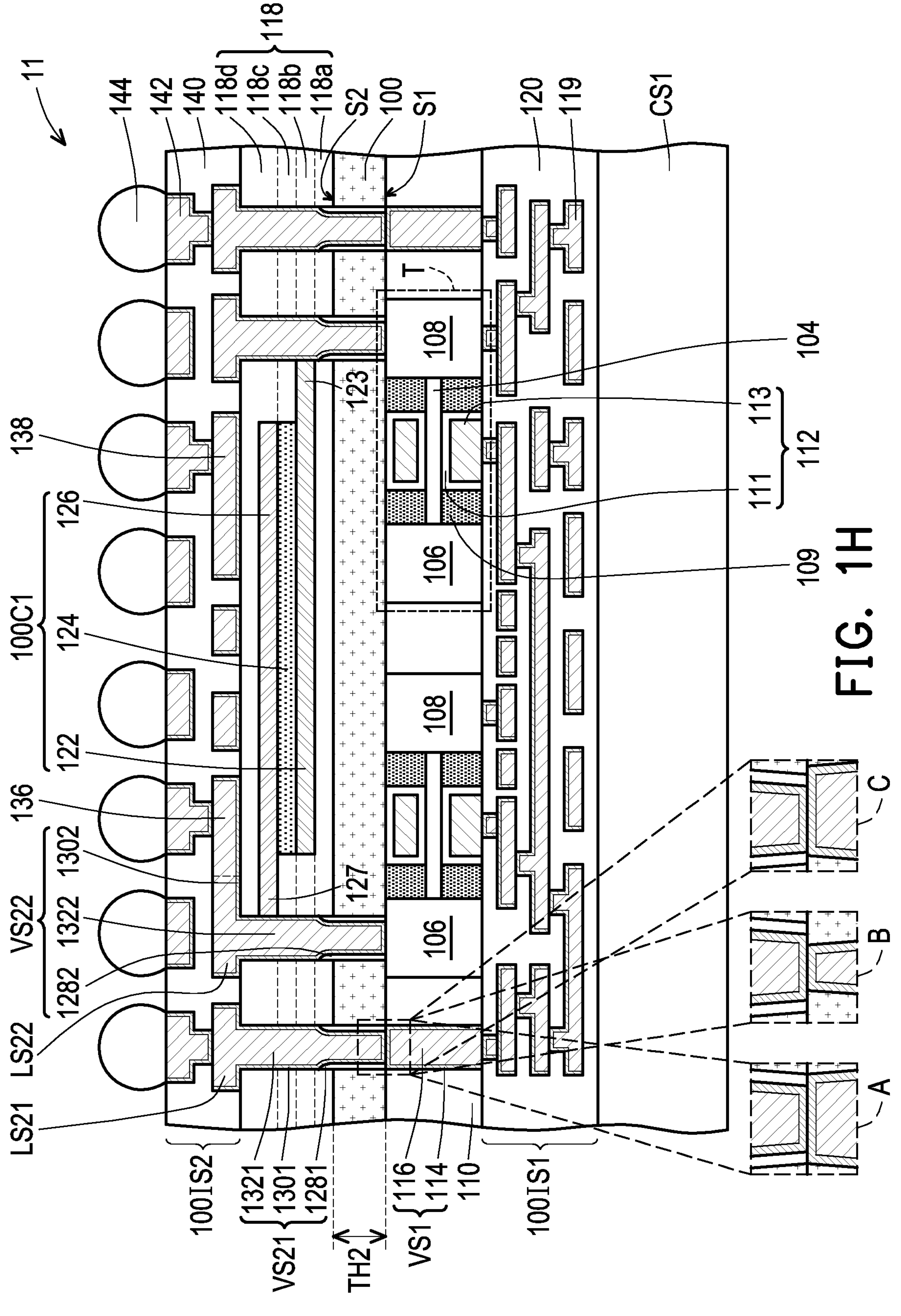
Figure 1I:
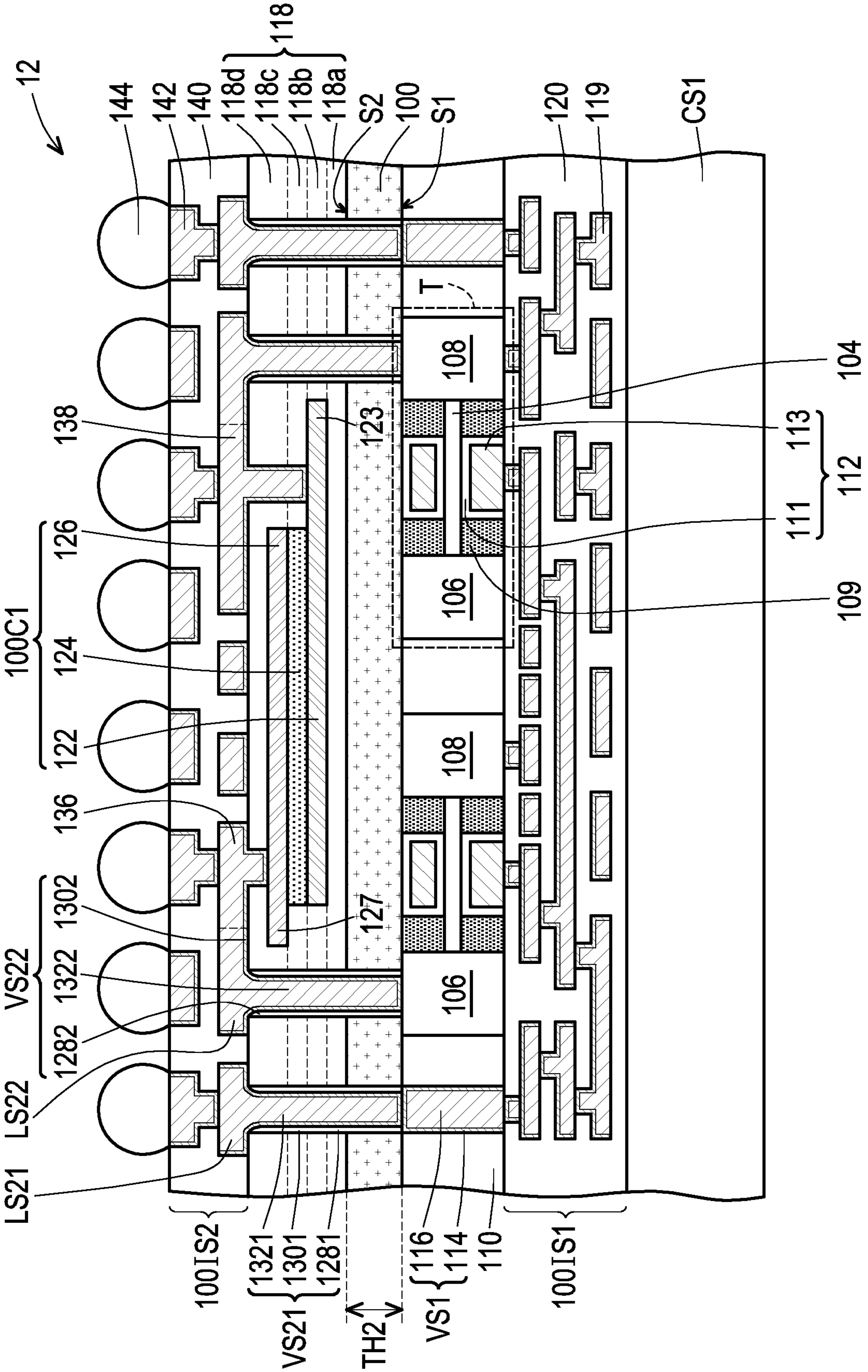

Referring to FIG. 1H, conductive terminals or bumps 144 are formed over and electrically connected to the interconnect structure 100IS2. In some embodiments, the bumps 144 are formed on the topmost metal features (e.g., under bump metal pads) of the interconnect structure 100IS2. In some embodiments, the bumps 144 include solder bumps, and/or may include metal pillars (e.g., copper pillars), solder caps formed on metal pillars, and/or the like. The bumps 144 may be formed by a suitable process such as evaporation, electroplating, ball drop, or screen printing. A semiconductor device 11 of some embodiments is thus completed.

In the semiconductor device 11 of some embodiments, the capacitor 100C1 and the transistor T are disposed at opposite sides of a thin substrate 100 and connected to each other through vertical power rails (including metal vias VS21 or VS22), so as to significantly shorten the electrical path and routing, and greatly improve the power integrity of the semiconductor device.

In some embodiments, in the vertical power rails of the semiconductor device 11, the metal vias VS21 and VS1 are aligned to each other and have substantially straight sidewalls. However, the disclosure is not limited thereto. In other embodiments, as shown in the enlarged views A to C of FIG. 1H, the metal vias VS21 and VS1 may have inclined sidewalls, the metal vias VS21 and VS1 may have different sizes, and/or the metal vias VS21 and VS1 may be misaligned with each other. The configurations of vertical power rails including metal vias VS1 and VS21 of the semiconductor device 11 are applicable to other semiconductor devices 12-18 and 20-21 which will be described below.

Besides, in the semiconductor device 11, the top and bottom metal electrodes of the MIM capacitor 100C are in direct contact to the sidewalls of the source and drain vias VS22. However, the disclosure is not limited thereto. In other embodiments, the top and bottom metal electrodes of the MIM capacitor are electrically connected to the source and drain vias with another configuration.

The semiconductor device 12 of FIG. 1I is similar to the semiconductor device 11 of FIG. 1H, so the difference between them is described in details below and the similarity is not iterated herein. In the capacitor 100C1 of the semiconductor device 12 of FIG. 1I, the bottom metal electrode 122 is electrically to the strained region 108 (e.g., source region) through the metal via VS22, the metal line LS22 and the metal feature 138, and the top metal electrode 126 is electrically to the strained region 106 (e.g., drain region) through the metal via VS22, the metal line LS22 and the metal feature 136. Specifically, the metal via of the metal feature 136 is landed on the top metal electrode 126, and the metal via of the metal feature 138 is landed on the extending portion 123 of the bottom metal electrode 122. In such case, the top surface of the insulator liner layer 1281/1282 of each metal via VS21/VS22 is substantially flushed with the top surface of the dielectric layer 118*d*.

The above embodiments in which the bumps are disposed at the backside of the substrate are provided for illustration purposes, and are not construed as limiting the present disclosure. In other embodiments, the bumps are disposed at the front side of the substrate as needed.

FIG. 2A to FIG. 2I illustrate cross-sectional views of a method of forming a semiconductor device in accordance with some embodiments of the present disclosure. The method of FIG. 2A to FIG. 2I is similar to the method of FIG. 1A to FIG. 1I, so the difference between them is described in details below and the similarity is not iterated herein. The materials, forming methods and element configurations of like elements of FIG. 2A to FIG. 2I are similar to the materials, forming methods and element configurations of like elements described in FIG. 1A to FIG. 1I, so the details are not iterated herein.

Figure 2A:
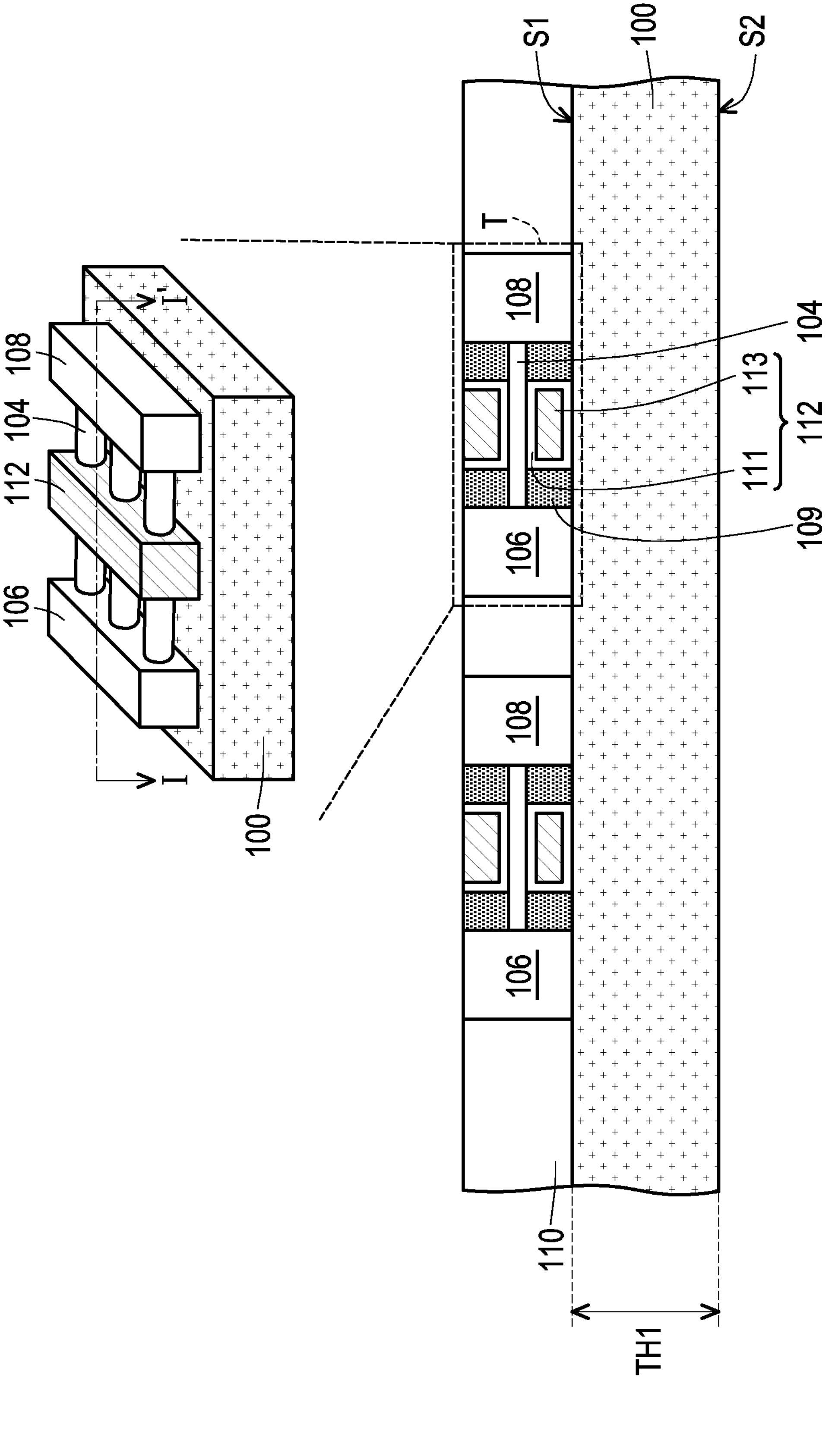
FIG. 2A to FIG. 2I illustrate cross-sectional views of a method of forming a semiconductor device in accordance with some embodiments of the present disclosure.

Referring to FIG. 2A, an operation similar to that described in FIG. 1A is performed, so as to form a transistor T at a first side S1 of the substrate 100 and a first dielectric layer 110 aside the transistor T. In some embodiments, the transistor T is a GAA transistor that includes a gate structure 112 surrounding nanowires 104 suspended by two strained regions 106 and 108.

Figure 2B:
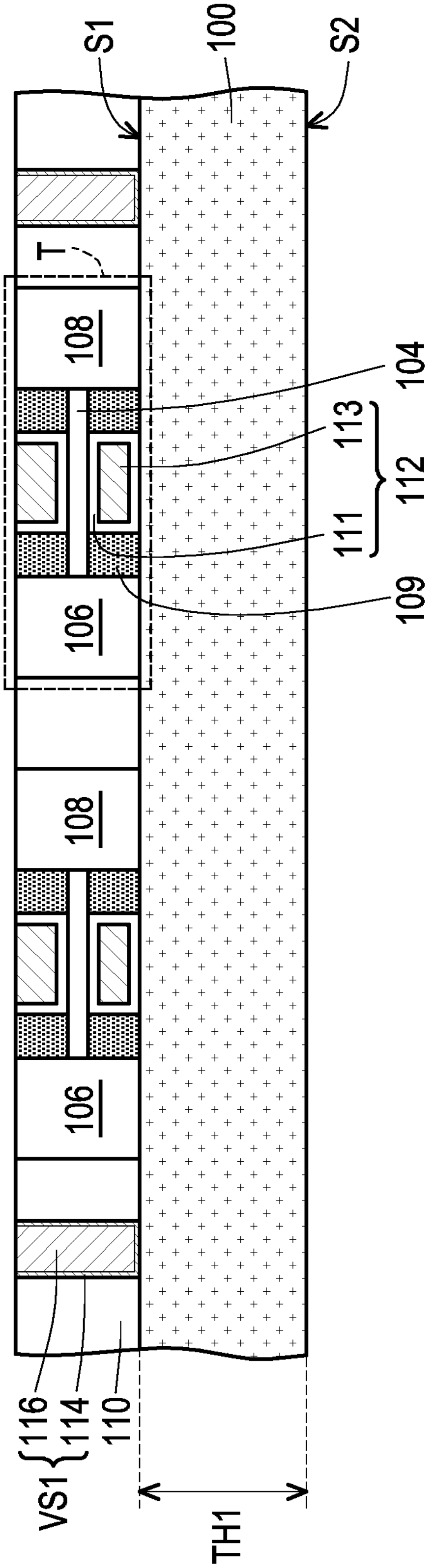

Referring to FIG. 2B, an operation similar to that described in FIG. 1B is performed, so as to form a first metal via VS1 that penetrates through the first dielectric layer 110 and is located aside the transistor T.

Figure 2C:
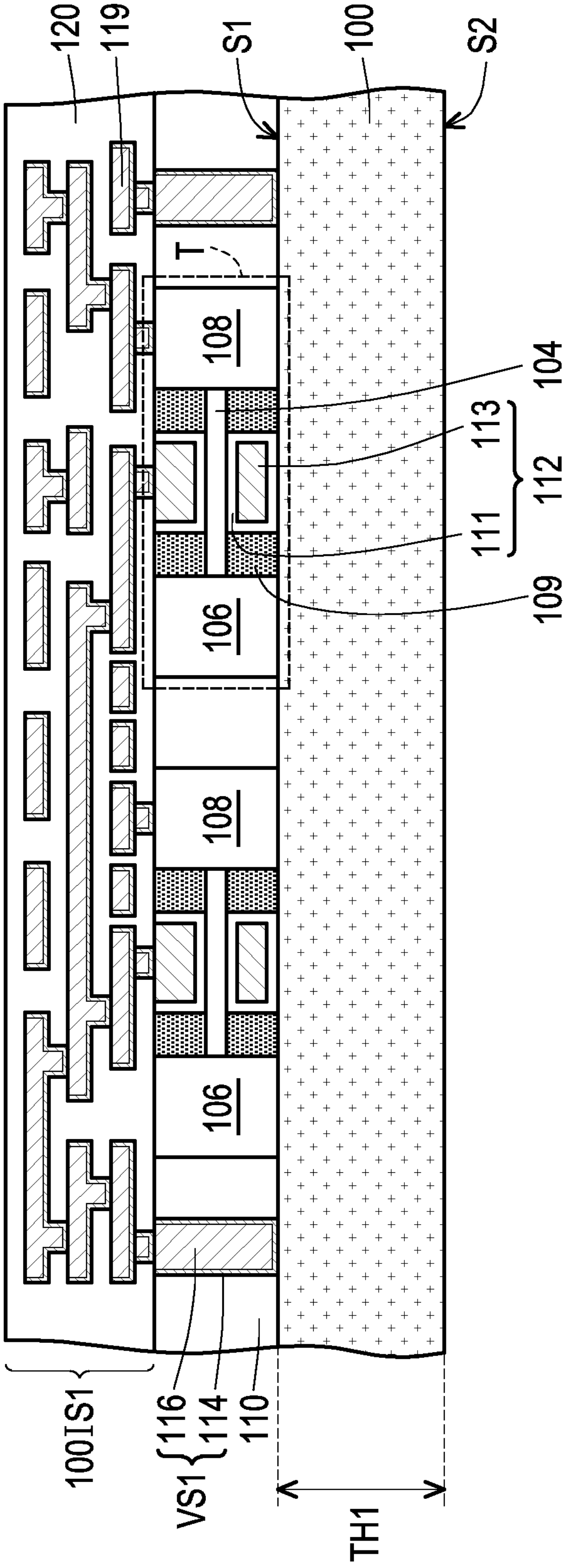

Referring to FIG. 2C, an operation similar to that described in FIG. 1C is performed, so as to form a first interconnect structure 100IS1 over the first side S1 of the substrate 100 and electrically connected to the transistor T and the first metal via VS1.

Figure 2D:
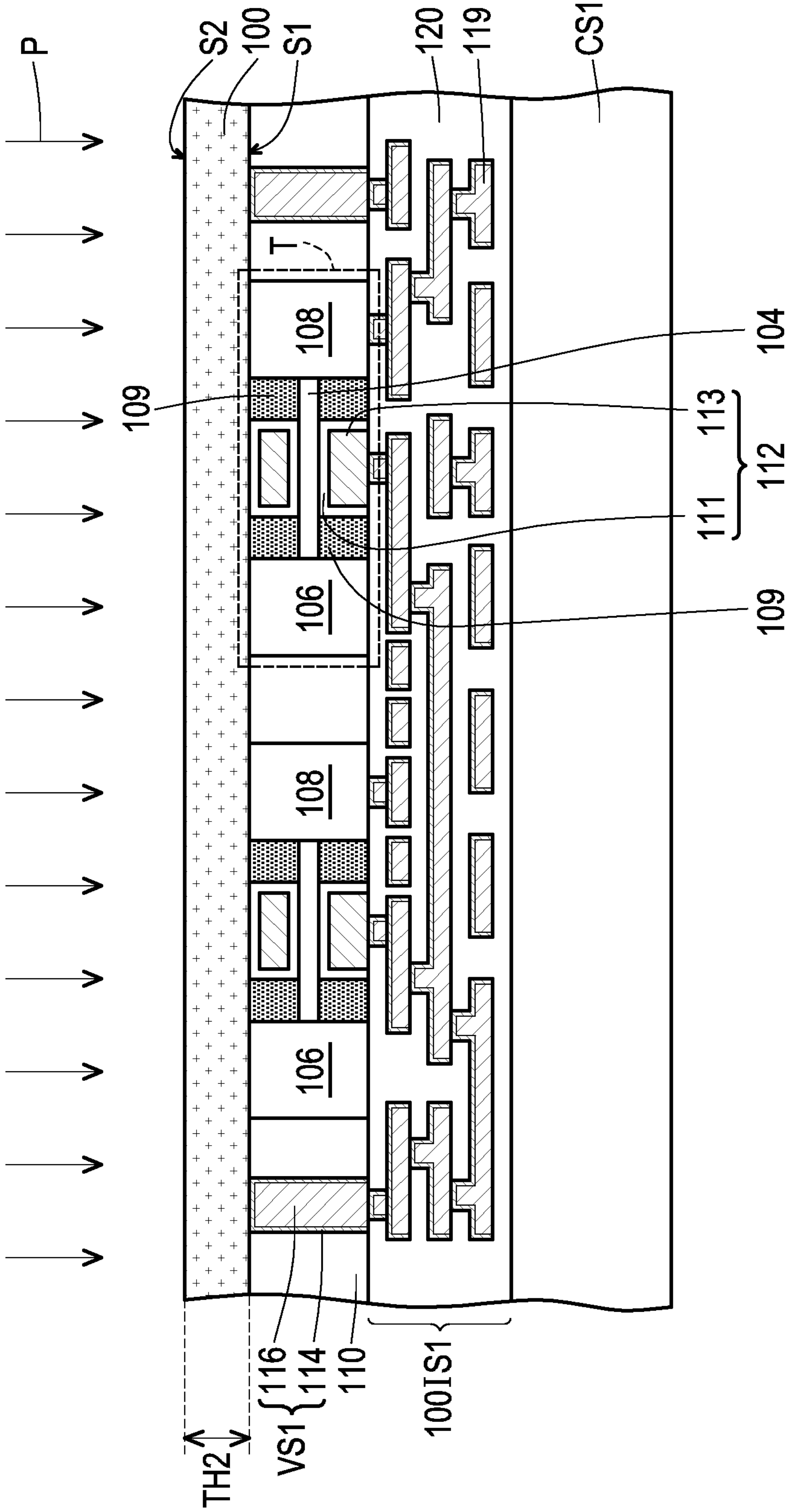

Referring to FIG. 2D, an operation similar to that described in FIG. 1D is performed, so as to thin the substrate 100 from a second side S2 opposite to the first side S1 of the substrate 100. In some embodiments, a first carrier CS1 is bonded to the first interconnect structure 100IS1 before the thinning operation.

Figure 2E:
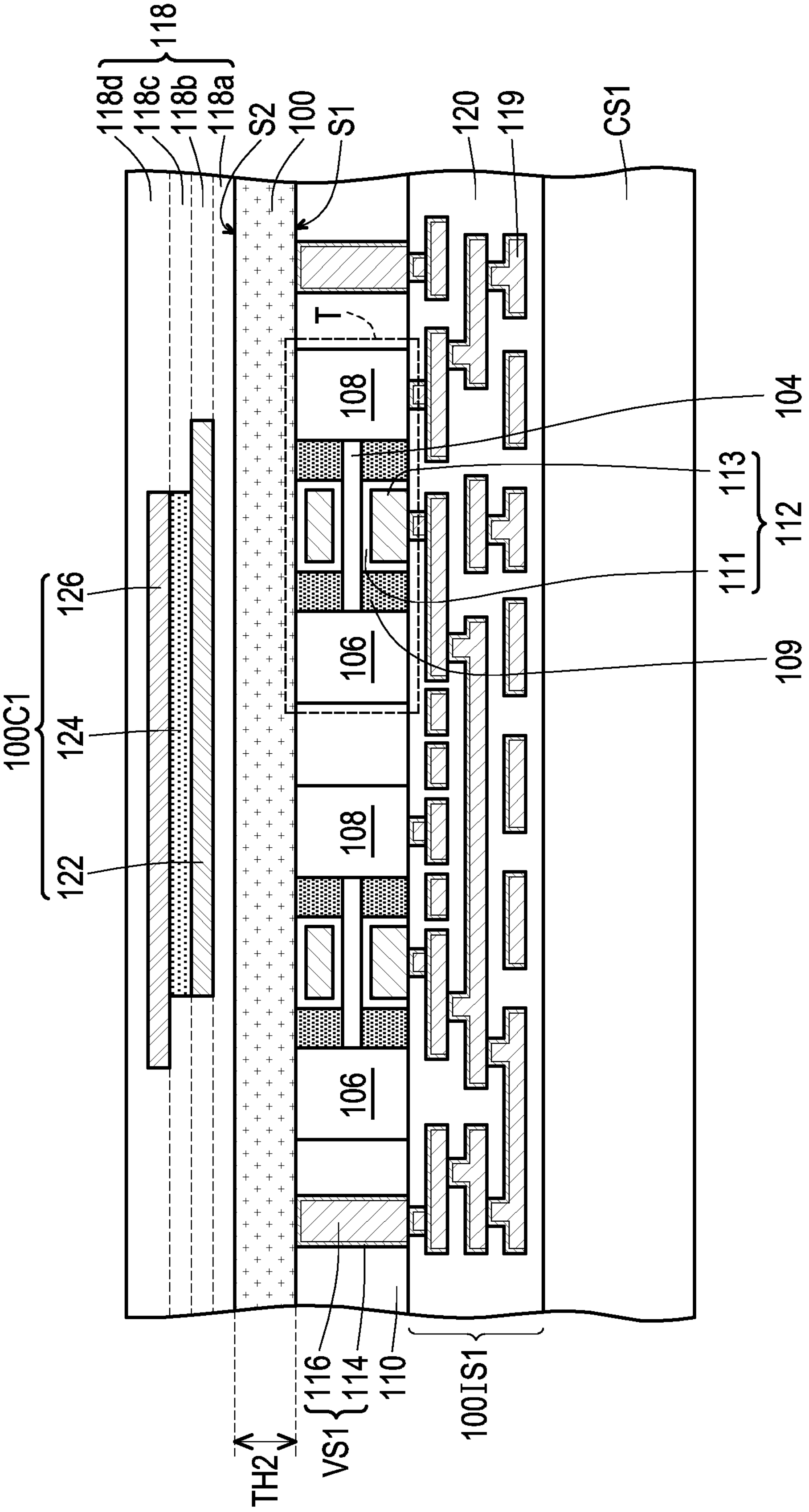

Referring to FIG. 2E, an operation similar to that described in FIG. 1E is performed, so as to form a capacitor 100C at the second side S2 of the substrate 100 and a second dielectric layer 118 aside the capacitor 100C1.

Figure 2F:
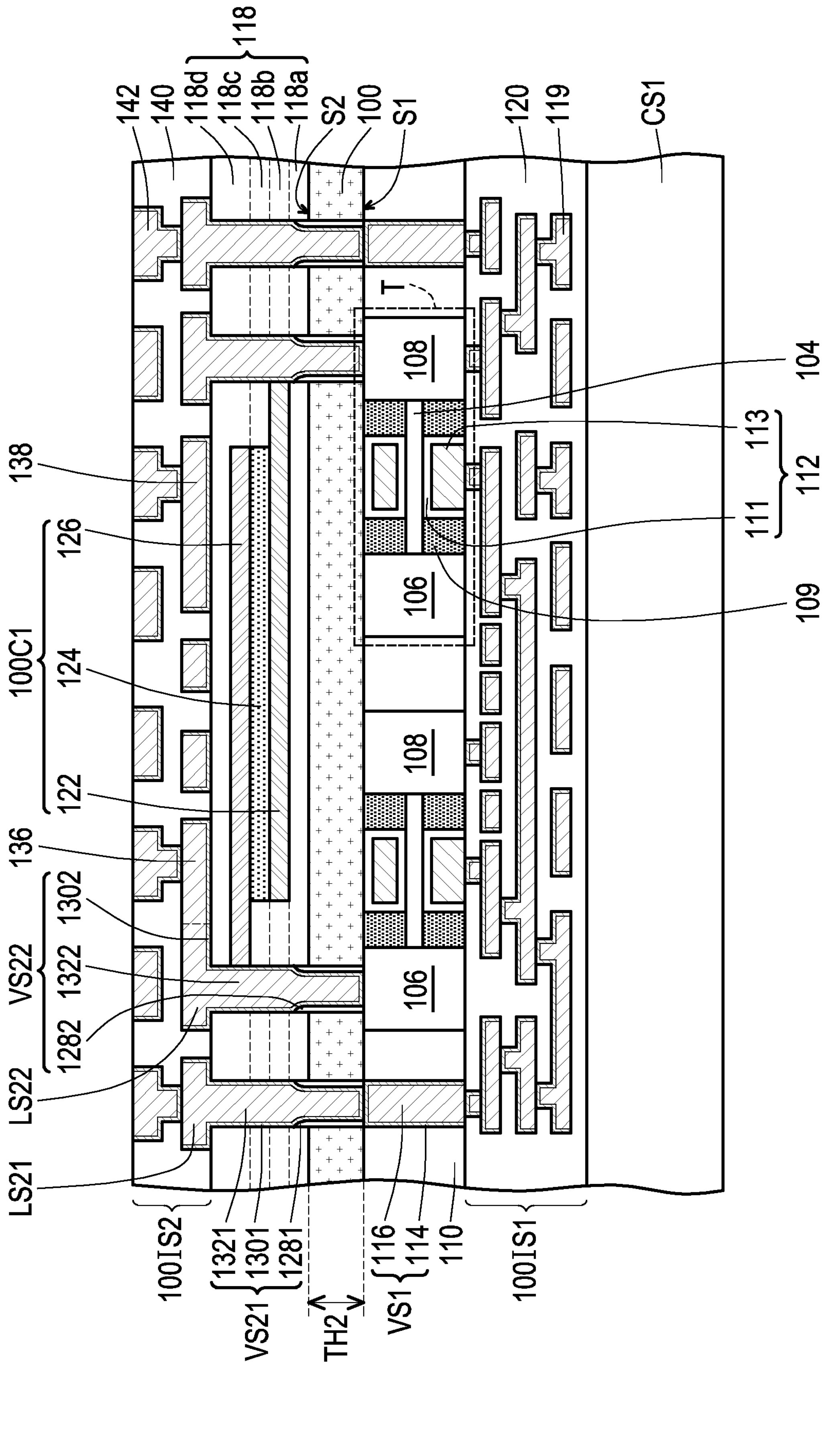

Referring to FIG. 2F, an operation similar to that described in FIG. 1F is performed, so as to form a second metal via VS21 that penetrates through the second dielectric layer 118 and the substrate 100 and is connected to the first metal via VS21. In some embodiments, during the formation of the second metal via VS21, a third metal via VS22 is simultaneously formed to penetrate through the second dielectric layer 118 and the substrate 100 and is electrically connected to one of the strained regions 106 and 108 of the transistor T. In some embodiments, the third metal via VS22 is electrically connected to one of metal electrodes of the capacitor 100C1.

Still referring to FIG. 2F, an operation similar to that described in FIG. 1G is performed, so as to form a second interconnect structure 100IS2 over the second side S2 of the substrate 100 and electrically connected to the capacitor 100C1 and the second metal via VS22.

Figure 2G:
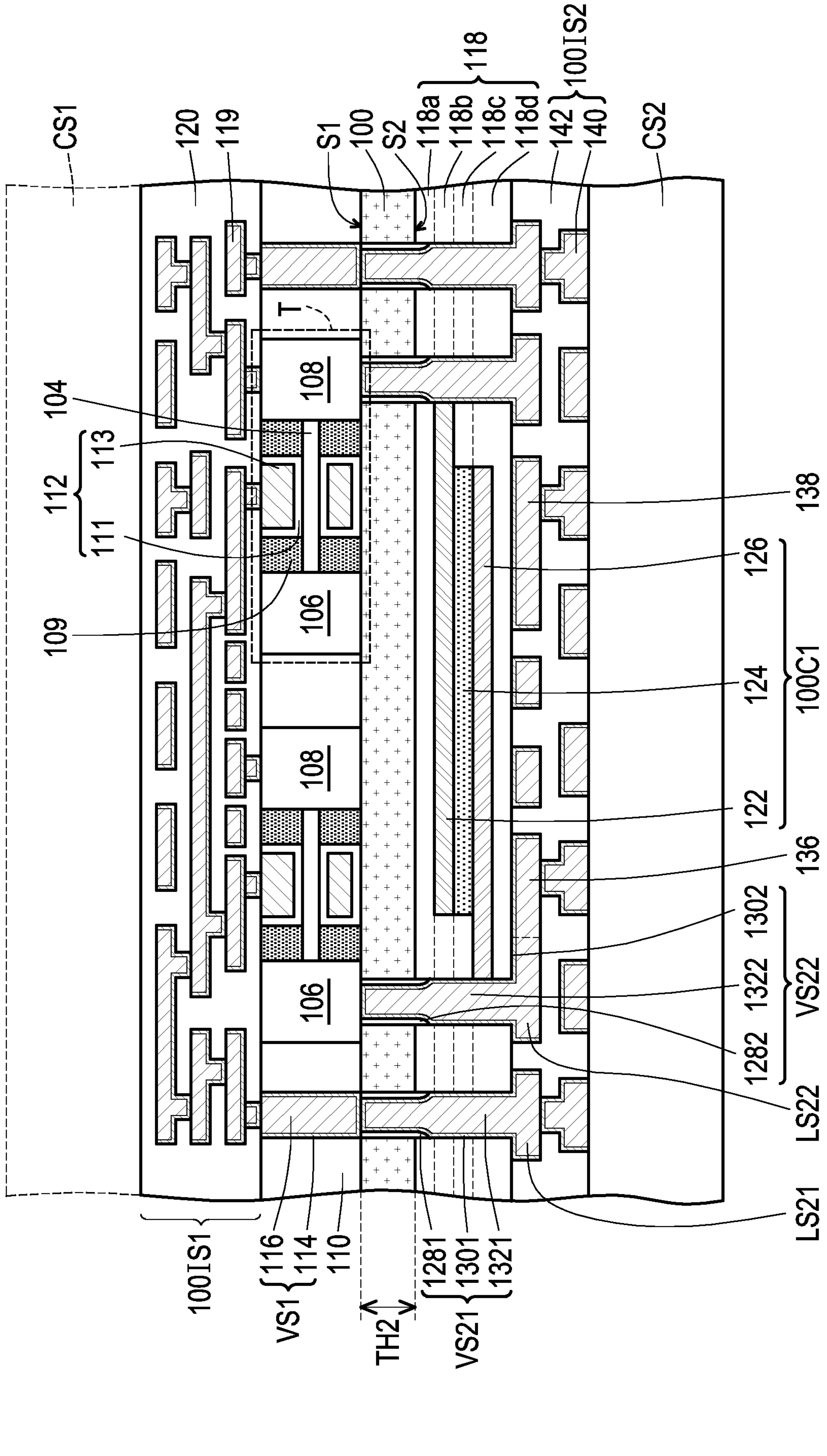

Referring to FIG. 2G, a second carrier CS2 is bonded to the second interconnect structure IS2 and the whole structure is then turned over, so the second side S2 of the substrate 100 faces up. The carrier CS2 may be a glass carrier, a silicon wafer or the like. In some embodiments, the carrier CS2 is bonded to the interconnect structure 110IS2 through an adhesive layer such as an Ultra-Violet (UV) glue, a Light-to-Heat Conversion (LTHC) glue, a die attach tape (DAF), or the like, although other types of adhesives may be used. Thereafter, the first carrier CS1 is removed or debonded from the first interconnect structure 100IS1.

Figure 2H:
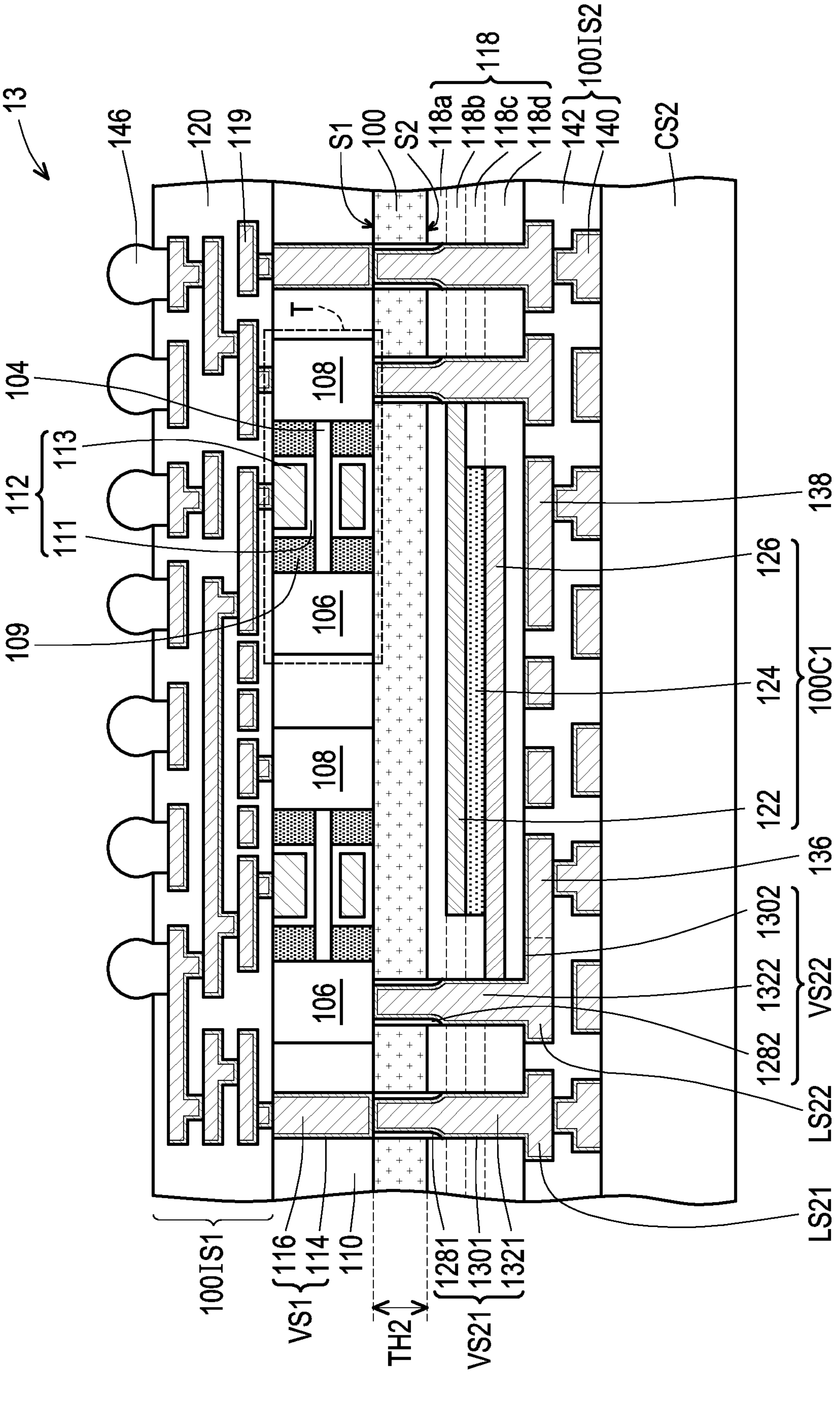

Referring to FIG. 2H, conductive terminals or bumps 146 are formed over and electrically connected to the interconnect structure 100IS1. In some embodiments, the bumps 146 are formed through the topmost dielectric layer and landed on the topmost metal features (e.g., under bump metal pads) of the interconnect structure 100IS1. In some embodiments, the bumps 146 include solder bumps, and/or may include metal pillars (e.g., copper pillars), solder caps formed on metal pillars, and/or the like. The bumps 146 may be formed by a suitable process such as evaporation, electroplating, ball drop, or screen printing. The semiconductor device 12 of some embodiments is thus completed.

In the semiconductor device 13 of some embodiments, the capacitor 100C1 and the transistor T are disposed at opposite sides of a thin substrate 100 and connected to each other through vertical power rails (including metal vias VS21 or VS22), so as to significantly shorten the electrical path and routing, and greatly improve the power integrity of the semiconductor device.

Besides, in the semiconductor device 13, the top and bottom metal electrodes of the MIM capacitor 100C1 are in direct contact to the sidewalls of the source and drain vias VS22. However, the disclosure is not limited thereto. In other embodiments, the top and bottom metal electrodes of the MIM capacitor are electrically connected to the source and drain vias with another configuration.

Figure 2I:
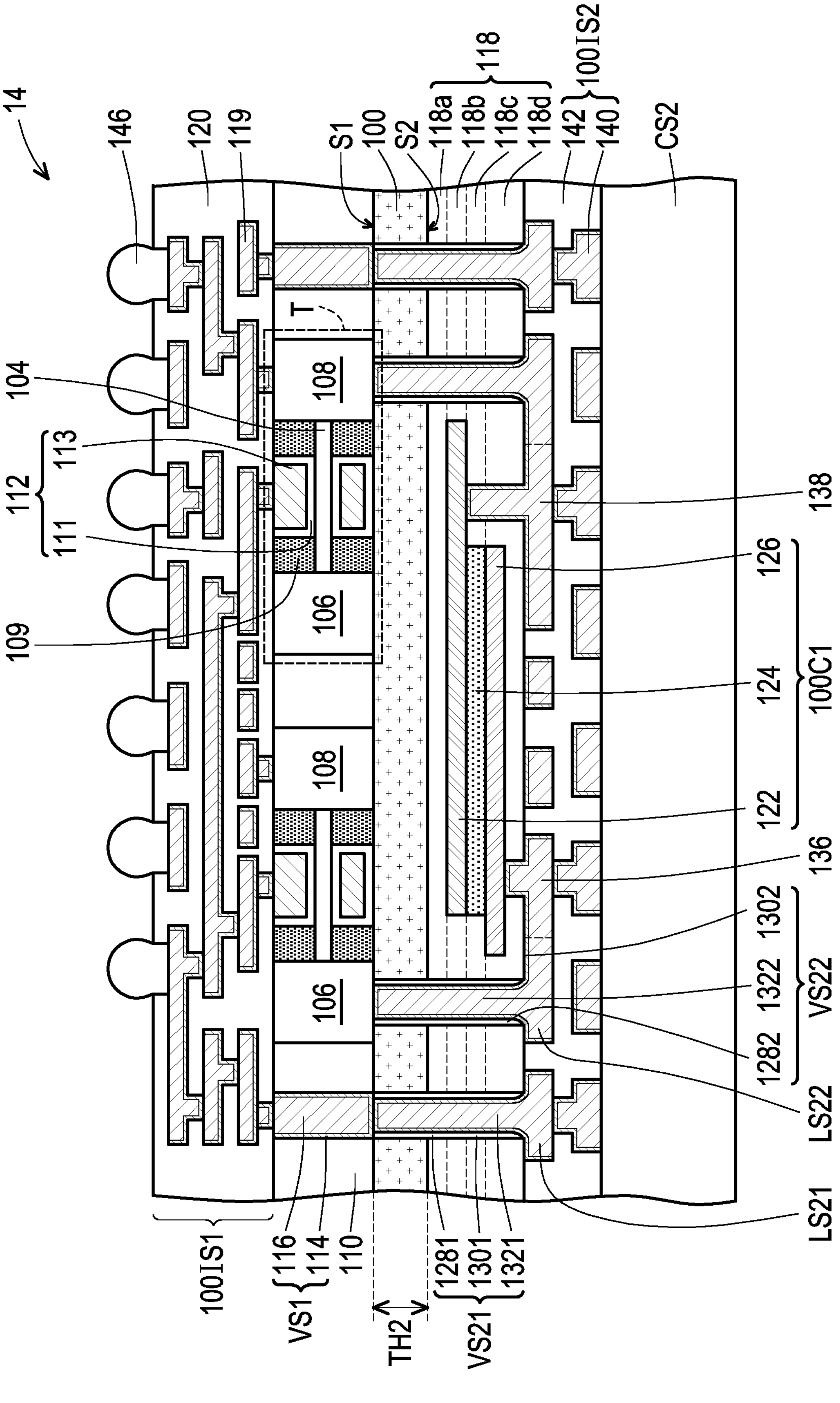

The semiconductor device 14 of FIG. 2I is similar to the semiconductor device 13 of FIG. 2H, so the difference between them is described in details below and the similarity is not iterated herein. In the capacitor 100C1 of the semiconductor device 14 of FIG. 2I, the bottom metal electrode 122 is electrically to the strained region 108 (e.g., source region) through the metal via VS22, the metal line LS22 and the metal feature 138, and the top metal electrode 126 is electrically to the strained region 106 (e.g., drain region) through the metal via VS22, the metal line LS22 and the metal feature 136. In such case, the top surface of the insulator liner layer 1281/1282 of each metal via VS21/VS22 is substantially flushed with the top surface of the dielectric layer 118*d*.

The above embodiments in which the capacitor is a planar MIM capacitor are provided for illustration purposes, and are not construed as limiting the present disclosure. In other embodiments, the capacitor can be another type of capacitor, such as trench-type MIM capacitor as needed.

FIG. 3A to FIG. 3G illustrate cross-sectional views of a method of forming a semiconductor device in accordance with some embodiments of the present disclosure. The method of FIG. 3A to FIG. 3G is similar to the method of FIG. 1A to FIG. 1I, so the difference between them is described in details below and the similarity is not iterated herein. The materials, forming methods and element configurations of like elements of FIG. 3A to FIG. 3G are similar to the materials, forming methods and element configurations of like elements described in FIG. 1A to FIG. 1I, so the details are not iterated herein.

Figure 3A:
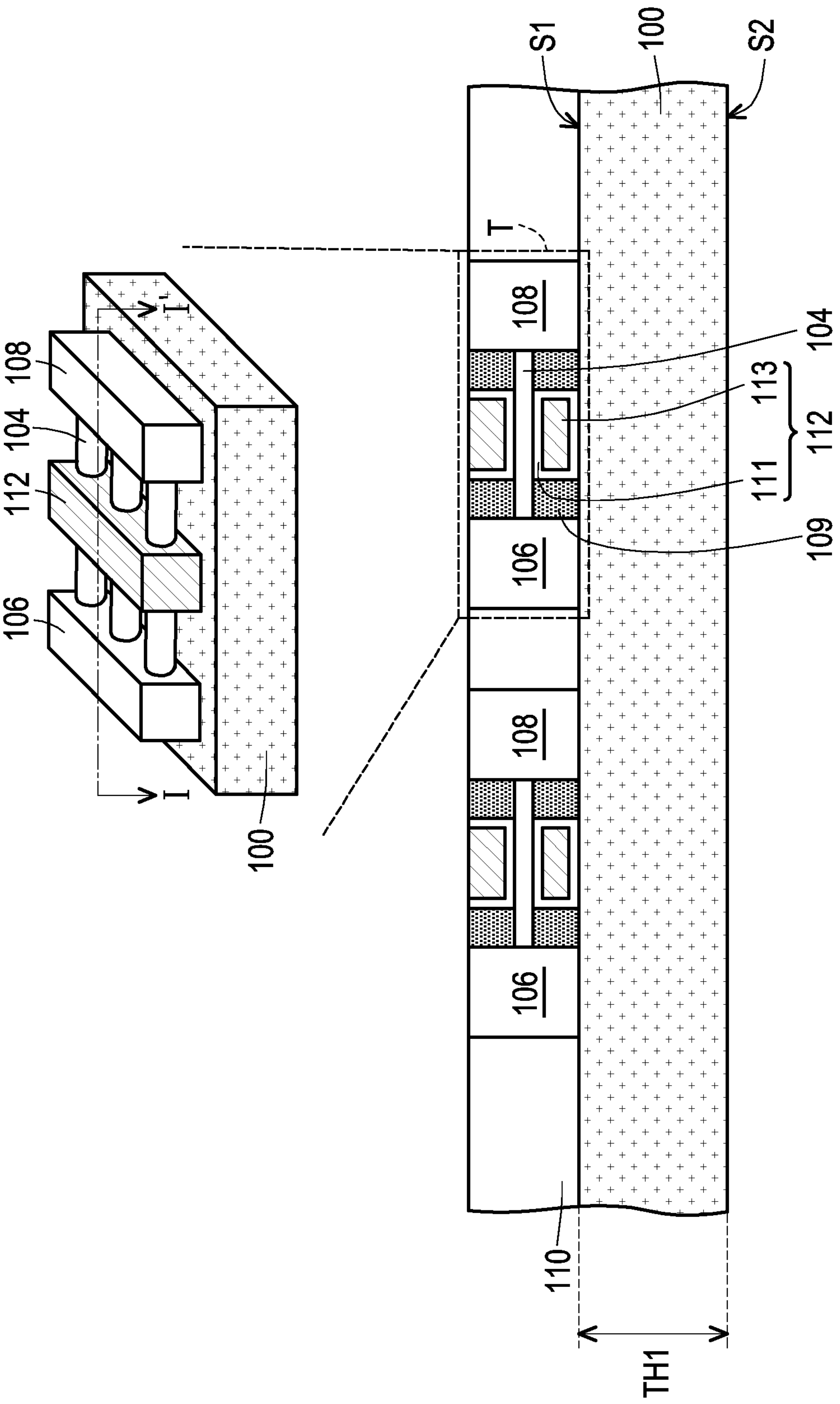
FIG. 3A to FIG. 3G illustrate cross-sectional views of a method of forming a semiconductor device in accordance with some embodiments of the present disclosure.

Referring to FIG. 3A, an operation similar to that described in FIG. 1A is performed, so as to form a transistor T at a first side S1 of the substrate 100 and a first dielectric layer 110 aside the transistor T. In some embodiments, the transistor T is a GAA transistor that includes a gate structure 112 surrounding nanowires 104 suspended by two strained regions 106 and 108.

Figure 3B:
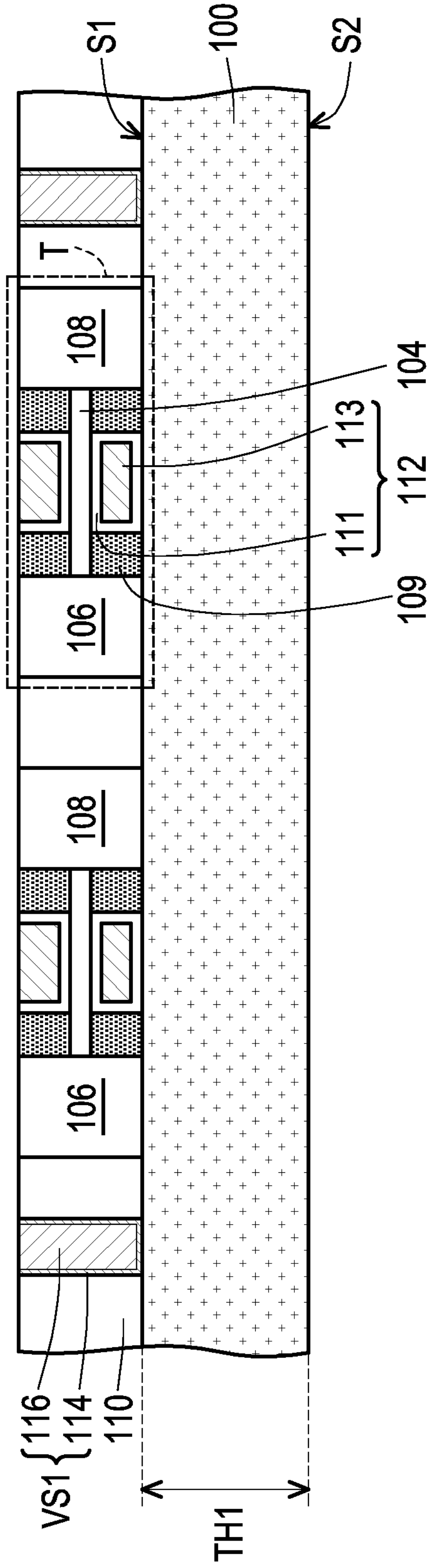

Referring to FIG. 3B, an operation similar to that described in FIG. 1B is performed, so as to form a first metal via VS1 that penetrates through the first dielectric layer 110 and is located aside the transistor T.

Figure 3C:
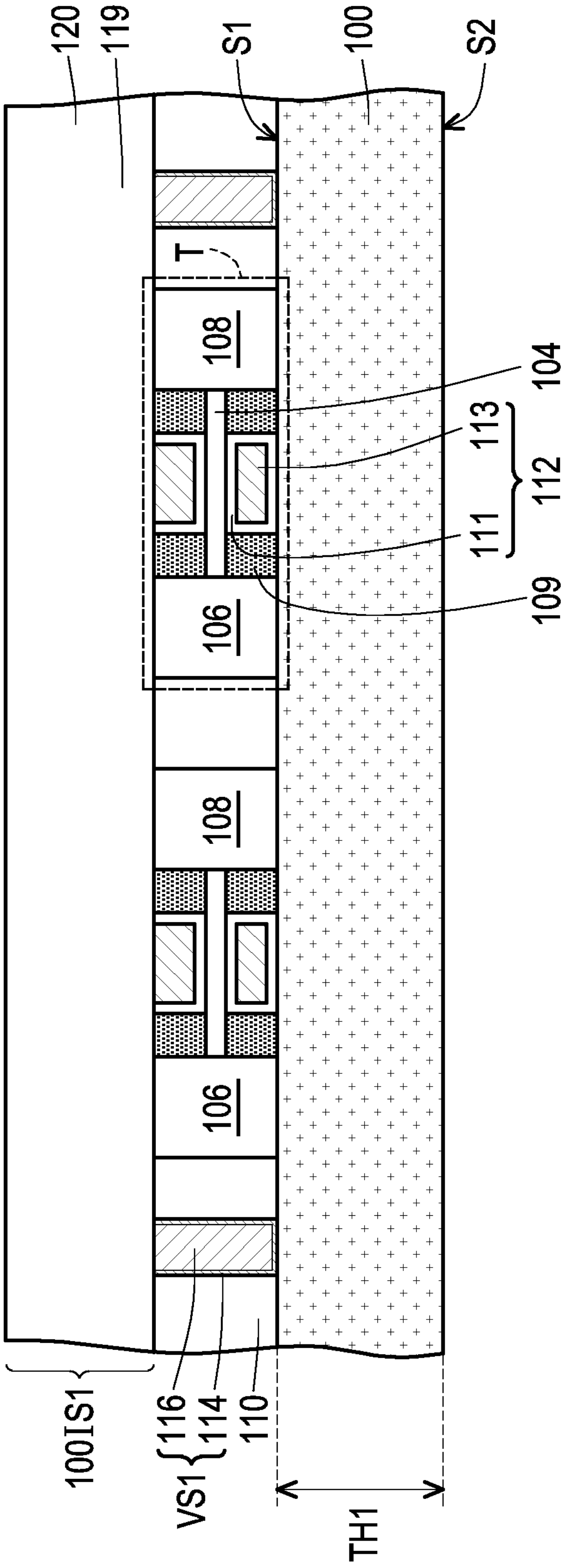

Referring to FIG. 3C, an operation similar to that described in FIG. 1C is performed, so as to form a first interconnect structure 100IS1 over the first side S1 of the substrate 100 and electrically connected to the transistor T and the first metal via VS1.

Figure 3D:
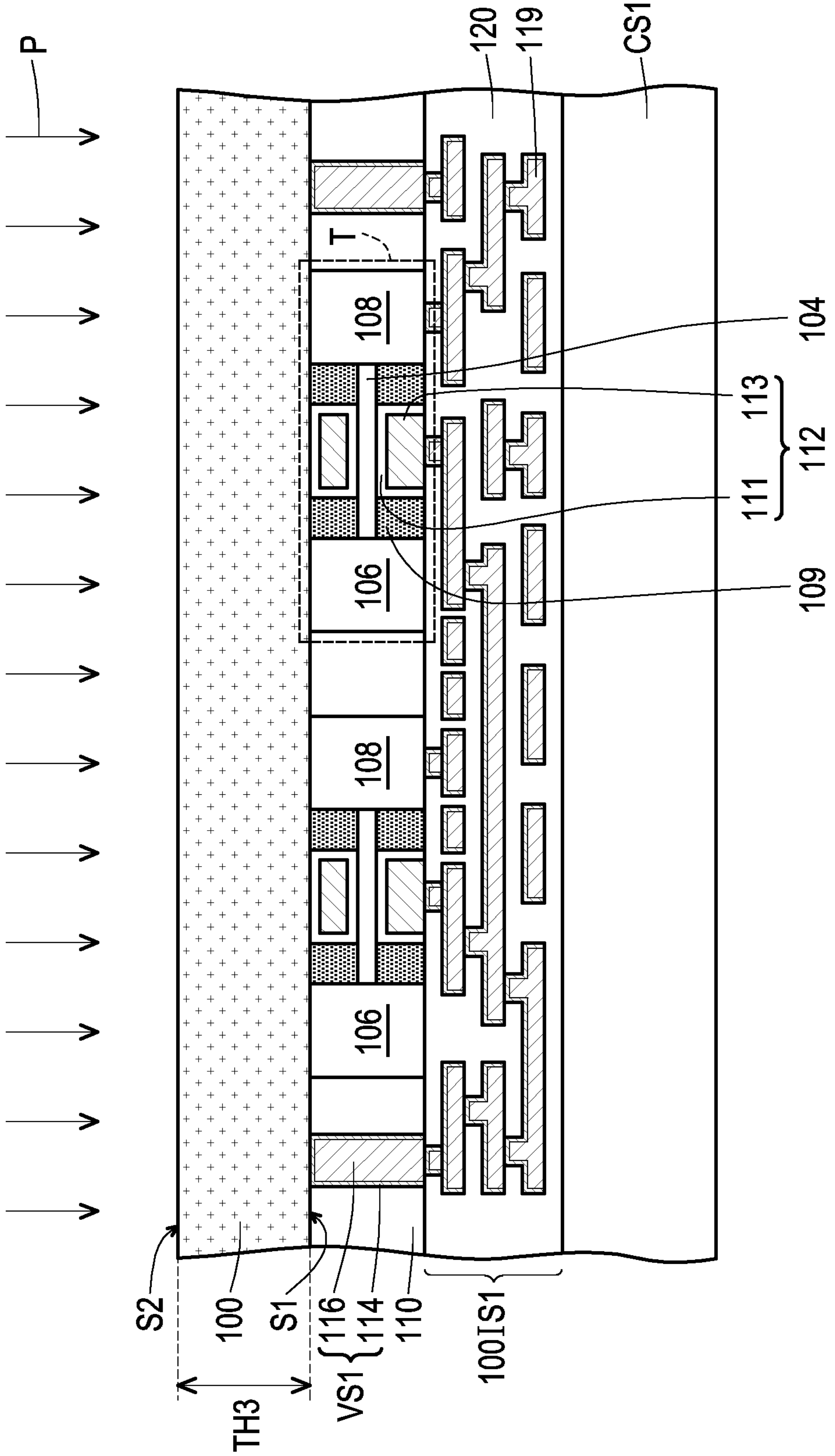

Referring to FIG. 3D, an operation similar to that described in FIG. 1D is performed, so as to thin the substrate 100 from a second side S2 opposite to the first side S1 of the substrate 100. In some embodiments, a first carrier CS1 is bonded to the first interconnect structure 100IS1 before the thinning operation. The difference between the operation of FIG. 3D and the operation of FIG. 1D lies in the thickness of the resulting substrate 100 after the thinning operation. In some embodiments, the thickness TH3 of the thinned substrate 100 of FIG. 3D is greater than the thickness TH2 the thinned substrate 100 of FIG. 1D. In some embodiments, the thickness TH3 of the thinned substrate 100 of FIG. 3D ranges from about 5 um to 15 um.

Figure 3E:
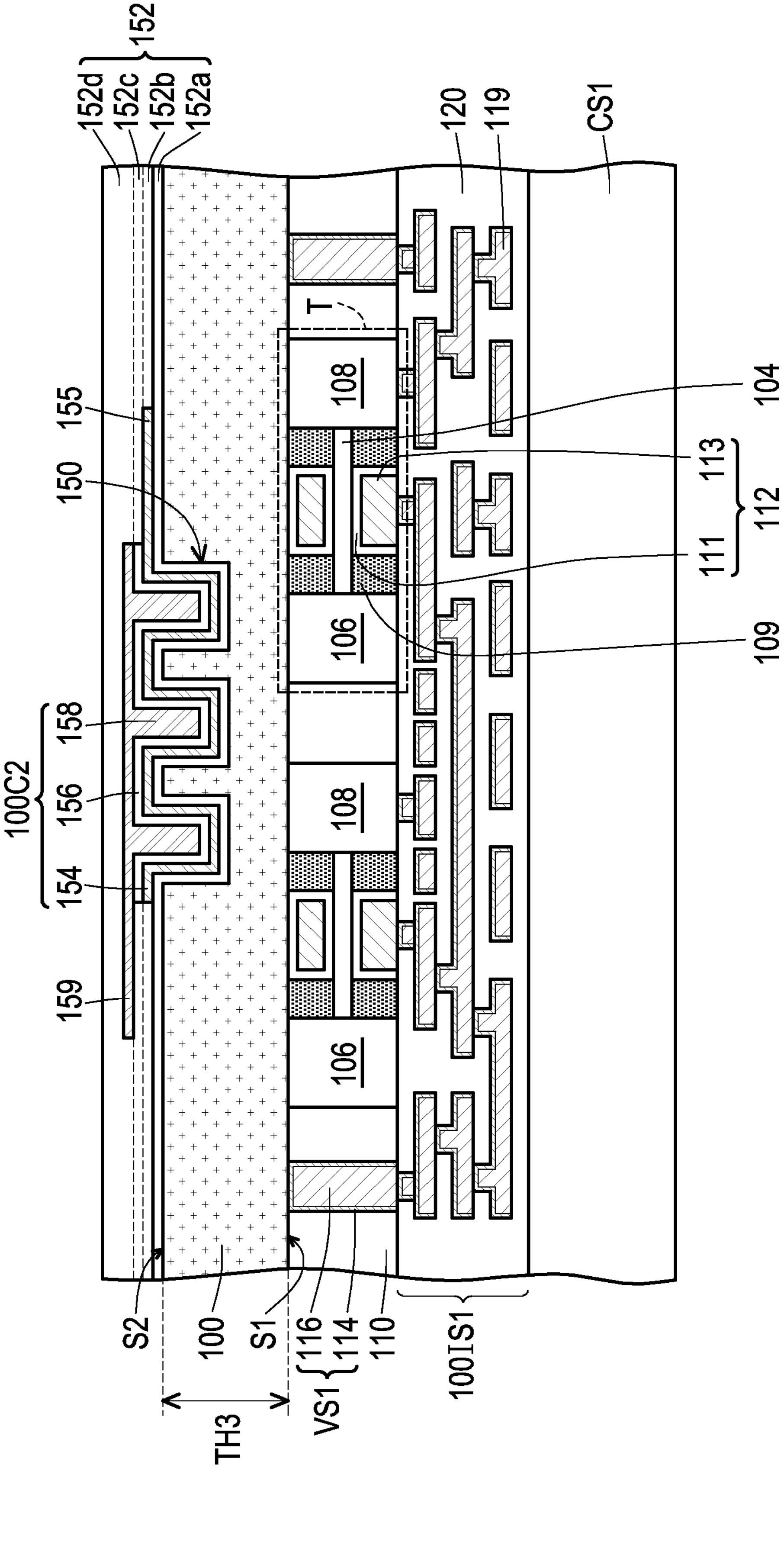

Referring to FIG. 3E, a capacitor 100C2 is formed in the second side S2 of the substrate 100 and embedded by the substrate 100 and the dielectric layers 152. In some embodiments, the capacitor 100C2 is a trench-type metal-insulator-metal (MIM) capacitor including a bottom metal electrode 154, a top metal electrode 158 and a capacitor dielectric layer 156 formed between the bottom metal electrode 154 and the top metal electrode 158. In some embodiments, the capacitor 100C2 is embedded by the substrate 100 and the dielectric layers 152. Specifically, the capacitor 100C2 extends from the second side S2 towards the first side S1 of the substrate 100. The method of forming the capacitor 100C2 includes forming trenches 150 in the substrate 100, and performing multiple depositing processes and patterning processes (e.g., photolithography and etching processes) alternatively. Accordingly, the bottom metal electrode 154 and the capacitor dielectric layer 156 are formed conformally along the topography of the trenches 150, and the top metal electrode 158 is formed to fill the trenches 150. The bottom metal electrode 154 is separated to the second side S2 of the substrate 100 by a dielectric layer 152*a* and embedded by a dielectric layer 152*b*. The capacitor dielectric layer 156 is disposed on the bottom metal electrode 154 and embedded by a dielectric layer 152*c*. The top metal electrode layer 158 is disposed on the capacitor dielectric layer 156 and embedded by a dielectric layer 152*d*. The dielectric layers 152*a* to 152*d* are collectively referred to as dielectric layers 152. Each of the bottom metal electrode 154 and the top metal electrode 158 may include a titanium (Ti) layer, a titanium nitride (TiN) layer, a tantalum (Ta) layer, a tantalum nitride (TaN) layer, the like, or a combination thereof. The capacitor dielectric layer 156 may include a nitride layer, a silicon nitride layer, or a high-k dielectric layer having a dielectric constant greater than 4. Exemplary high-k layer may include hafnium dioxide, hafnium silicate, zirconium silicate, zirconium dioxide, the like, or a combination thereof. The capacitor dielectric layer 156 may be a single-layer or a multi-layer structure. The thickness of each of the bottom metal electrode 154, the capacitor dielectric layer 156 and the top metal electrode 158 may range from about 0.05 um to 0.15 um. In some embodiments, the capacitance of the capacitor 100C2 ranges from about $10^{-9}$ F to $10^{-6}$ F. In some embodiments, the bottom metal electrode 154 has an extending portion 155 not covered by (or misaligned with) the top metal electrode 158 and the capacitor dielectric layer 156. In some embodiments, the top metal electrode 158 includes an extending portion 159 misaligned with the underlying the capacitor dielectric layer 156 and the bottom metal electrode 154. In some embodiments, one sidewall of the capacitor dielectric layer 156 is aligned with the sidewall of the bottom metal electrode 154, and the opposite sidewall of the capacitor dielectric layer 156 is aligned with the sidewall of the top metal electrode 158.

The dielectric layers 152 may include inter-metal dielectric (IMD) layers. The IMD layers may include silicon oxide, silicon oxynitride, silicon nitride, a low low-k material having a dielectric constant less than 3.5, the like, or a combination thereof. The dielectric layers 152 and the capacitor dielectric layer 156 may include different materials. The topmost dielectric layer 152*d* covers the top and sidewall of the top metal electrode layer 158.

Figure 3F:
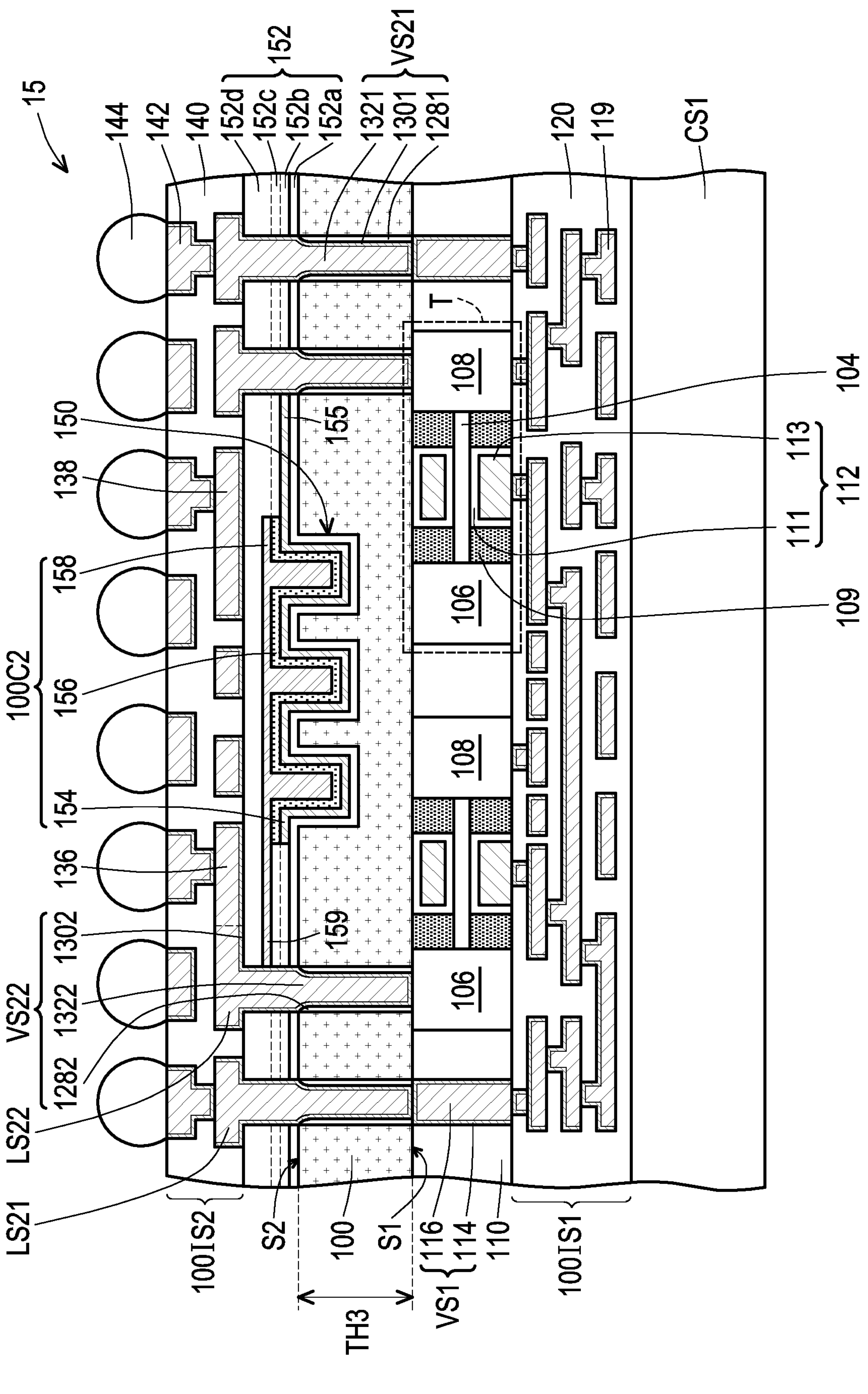

Referring to FIG. 3F, an operation similar to that described in FIG. 1F is performed, so as to form a second metal via VS21 that penetrates through the second dielectric layer 118 and the substrate 100 and is connected to the first metal via VS21. In some embodiments, during the formation of the second metal via VS21, a third metal via VS22 is simultaneously formed to penetrate through the second dielectric layer 118 and the substrate 100 and is electrically connected to one of the strained regions 106 and 108 of the transistor T. In some embodiments, the third metal via VS22 is electrically connected to (e.g., in physical contact with) one of metal electrodes of the capacitor 100C2.

Thereafter, an operation similar to that described in FIG. 1G is performed, so as to form a second interconnect structure 100IS2 over the second side S2 of the substrate 100 and electrically connected to the capacitor 100C2 and the second metal via VS22.

Afterwards, an operation similar to that described in FIG. 1H is performed, so as to form conductive terminals or bumps 144 over to the interconnect structure 100IS2. A semiconductor device 15 of some embodiments is thus completed.

In the semiconductor device 15 of some embodiments, the capacitor 100C2 and the transistor T are disposed at opposite sides of a thin substrate 100 and connected to each other through vertical power rails (including metal vias VS21 or VS22), so as to significantly shorten the electrical path and routing, and greatly improve the power integrity of the semiconductor device.

Besides, in the semiconductor device 15, the top and bottom metal electrodes of the MIM capacitor 100C2 are in direct contact to the sidewalls of the source and drain vias VS22. However, the disclosure is not limited thereto. In such case as shown in FIG. 3F, the top surface of the insulator liner layer 1281/1282 of each metal via VS21/VS22 is substantially flushed with the second side S2 of the substrate 100. In other embodiments, the top and bottom metal electrodes of the MIM capacitor are electrically connected to the source and drain vias with another configuration.

Figure 3G:
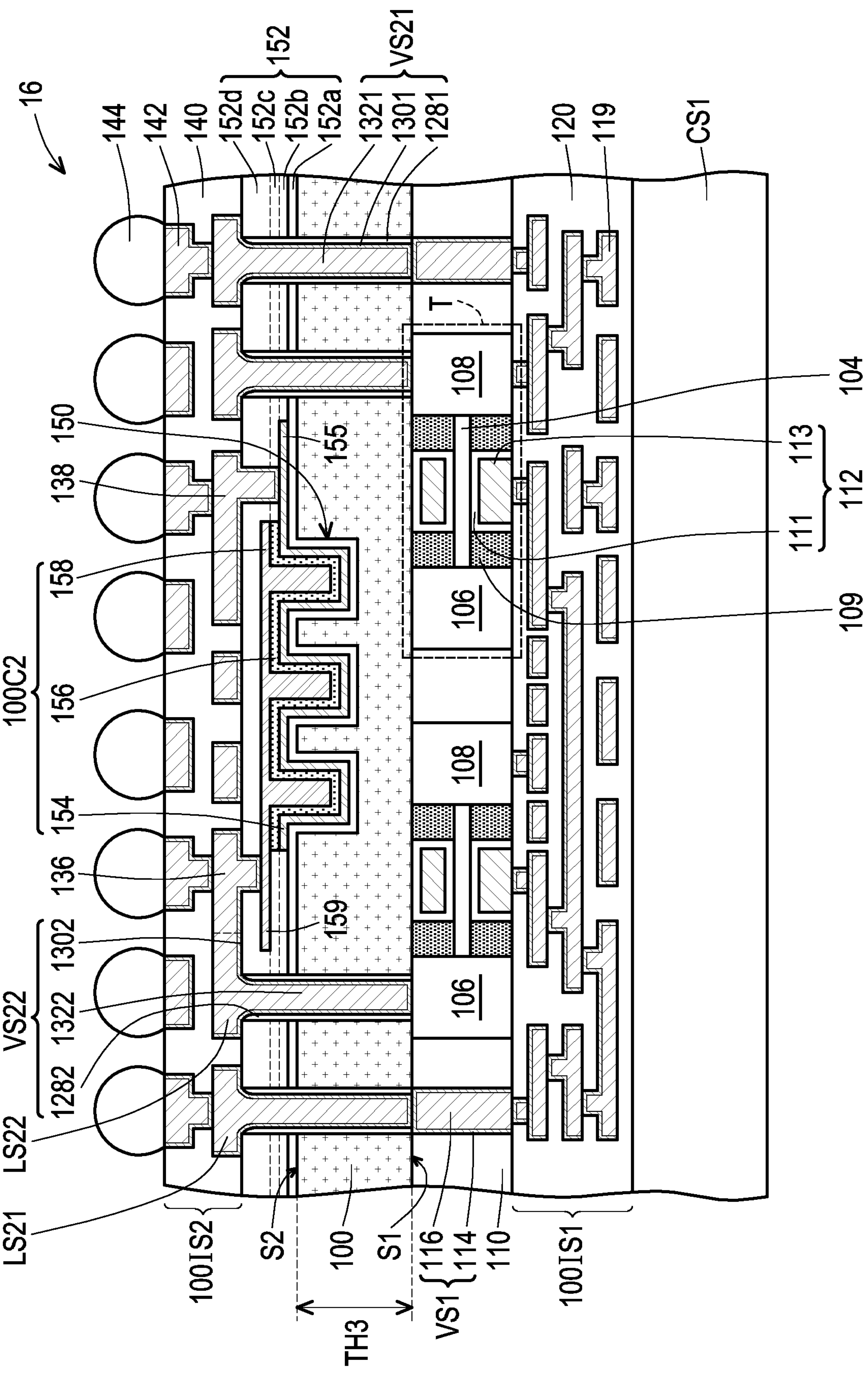

The semiconductor device 16 of FIG. 3G is similar to the semiconductor device 15 of FIG. 3F, so the difference between them is described in details below and the similarity is not iterated herein. In the capacitor 100C2 of the semiconductor device 16 of FIG. 3G, the bottom metal electrode 154 is electrically to the strained region 108 (e.g., source region) through the metal via VS22, the metal line LS22 and the metal feature 138, and the top metal electrode 158 is electrically to the strained region 106 (e.g., drain region) through the metal via VS22, the metal line LS22 and the metal feature 136. In such case as shown in FIG. 3G, the top surface of the insulator liner layer 1282 of each metal via VS22 is substantially flushed with the top surface of the dielectric layer 118*d*.

Figure 4A:
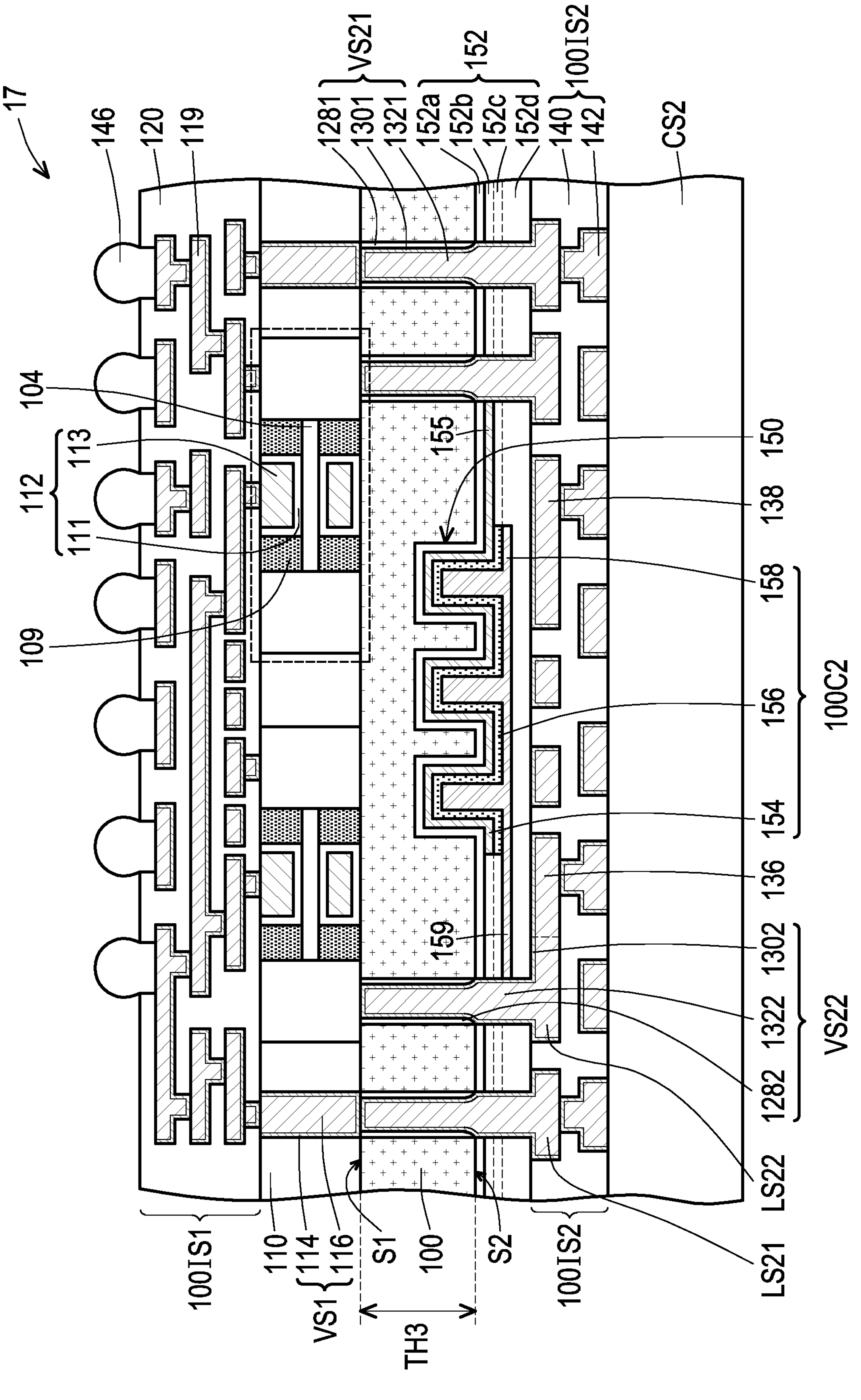
FIG. 4A and FIG. 4B illustrate cross-sectional views of semiconductor devices in accordance with some embodiments of the present disclosure.
Figure 4B:
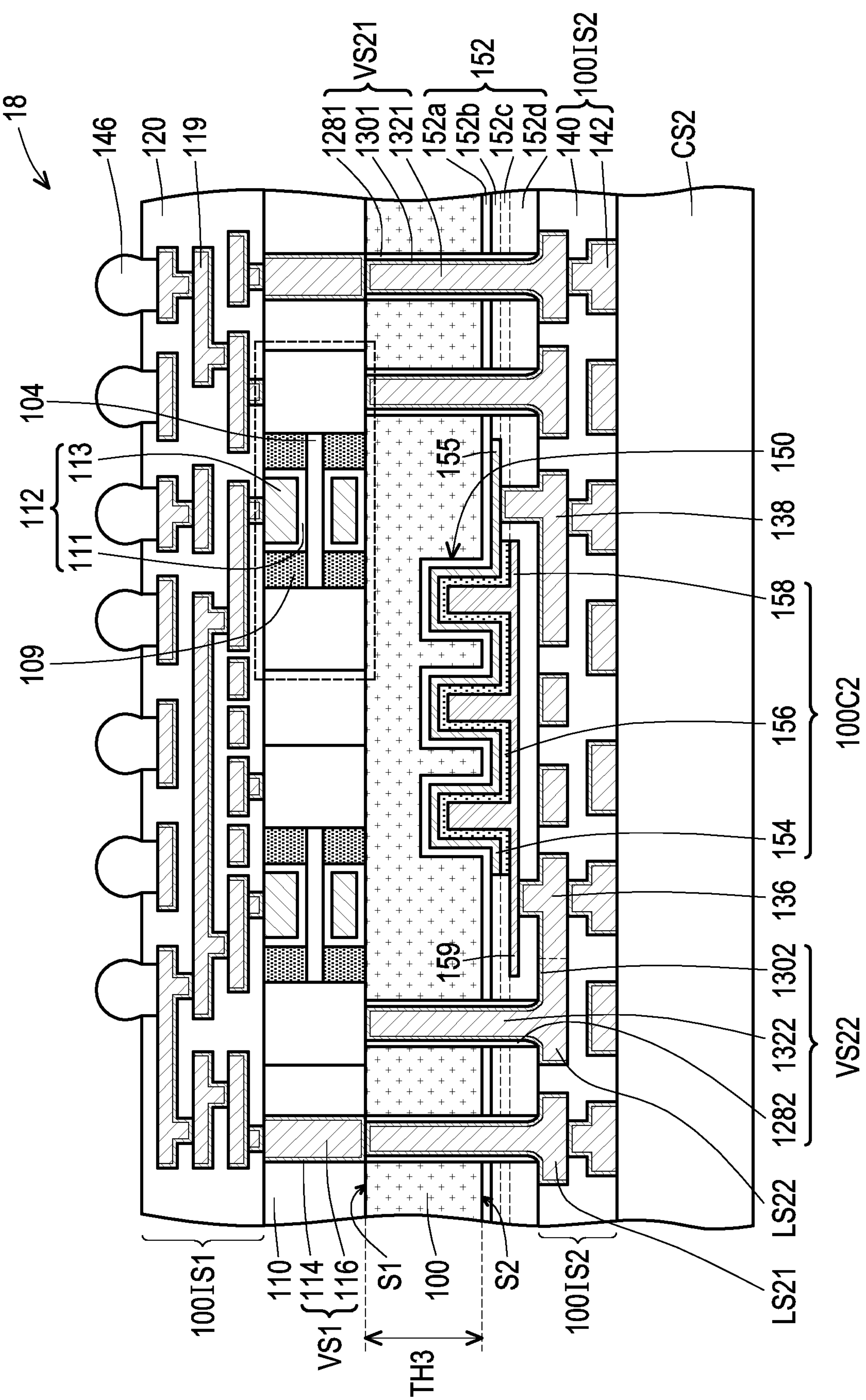

FIG. 4A and FIG. 4B illustrate cross-sectional views of semiconductor devices in accordance with some embodiments of the present disclosure.

The semiconductor device 17 of FIG. 4A is similar to the semiconductor device 15 of FIG. 3F, and the difference between them lies in the bump locations. In the semiconductor device 15 of FIG. 3F, bumps 144 are disposed at the backside of the substrate 100, while in the semiconductor device 17 of FIG. 4A, bumps 146 are disposed at the front side of the substrate 100.

The semiconductor device 18 of FIG. 4B is similar to the semiconductor device 16 of FIG. 3G, and the difference between them lies in the bump locations. In the semiconductor device 16 of FIG. 3G, bumps 144 are disposed at the backside of the substrate 100, while in the semiconductor device 18 of FIG. 4B, bumps 146 are disposed at the front side of the substrate 100.

The above embodiments in which the capacitor and the transistor are disposed at opposite sides of the same substrate are provided for illustration purposes, and are not construed as limiting the present disclosure. In other embodiments, the capacitor is provided by a second substrate and then bonded to the backside of the first substrate.

Figure 5A:
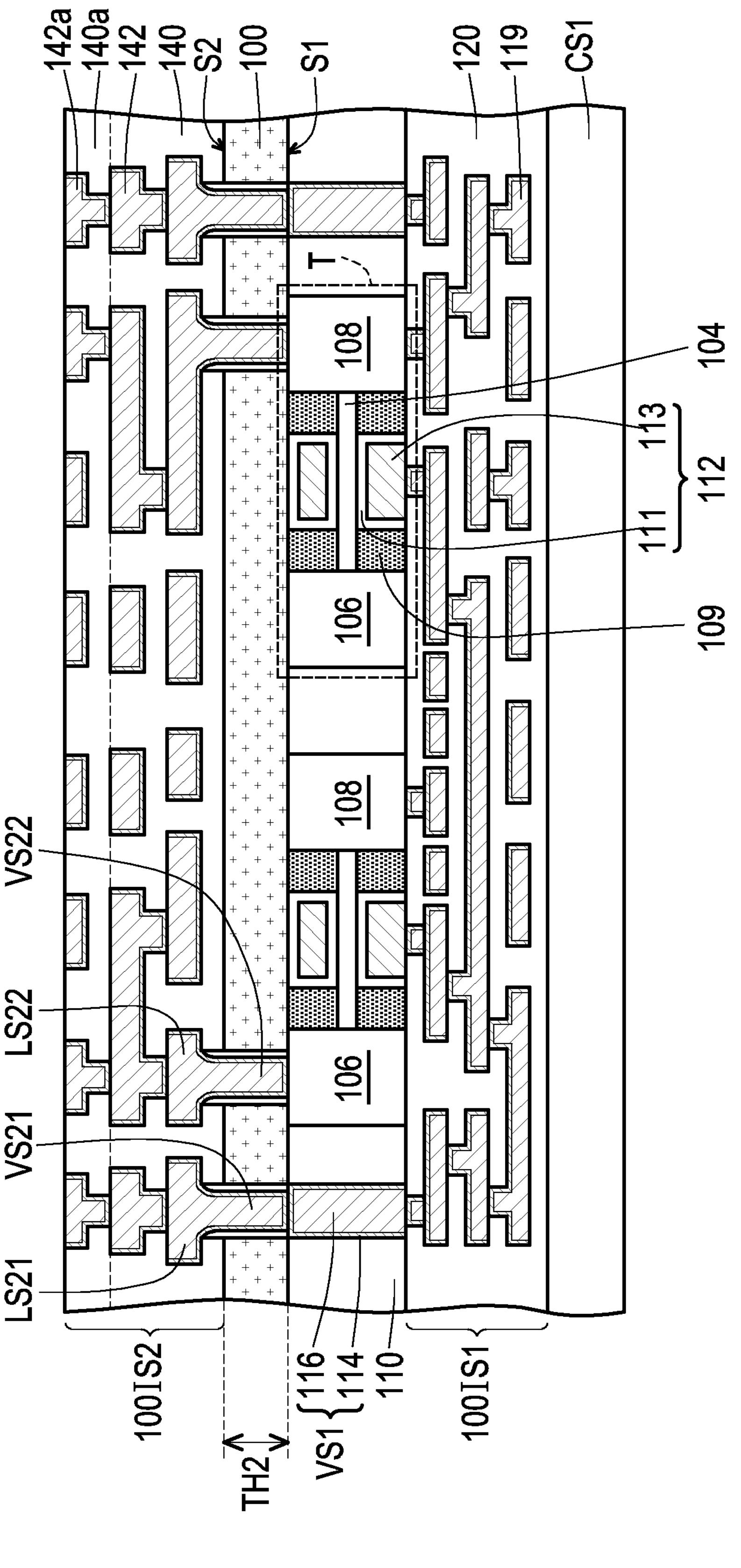
FIG. 5A to FIG. 5C illustrate cross-sectional views of a method of forming a semiconductor device in accordance with some embodiments of the present disclosure.
Figure 5B:
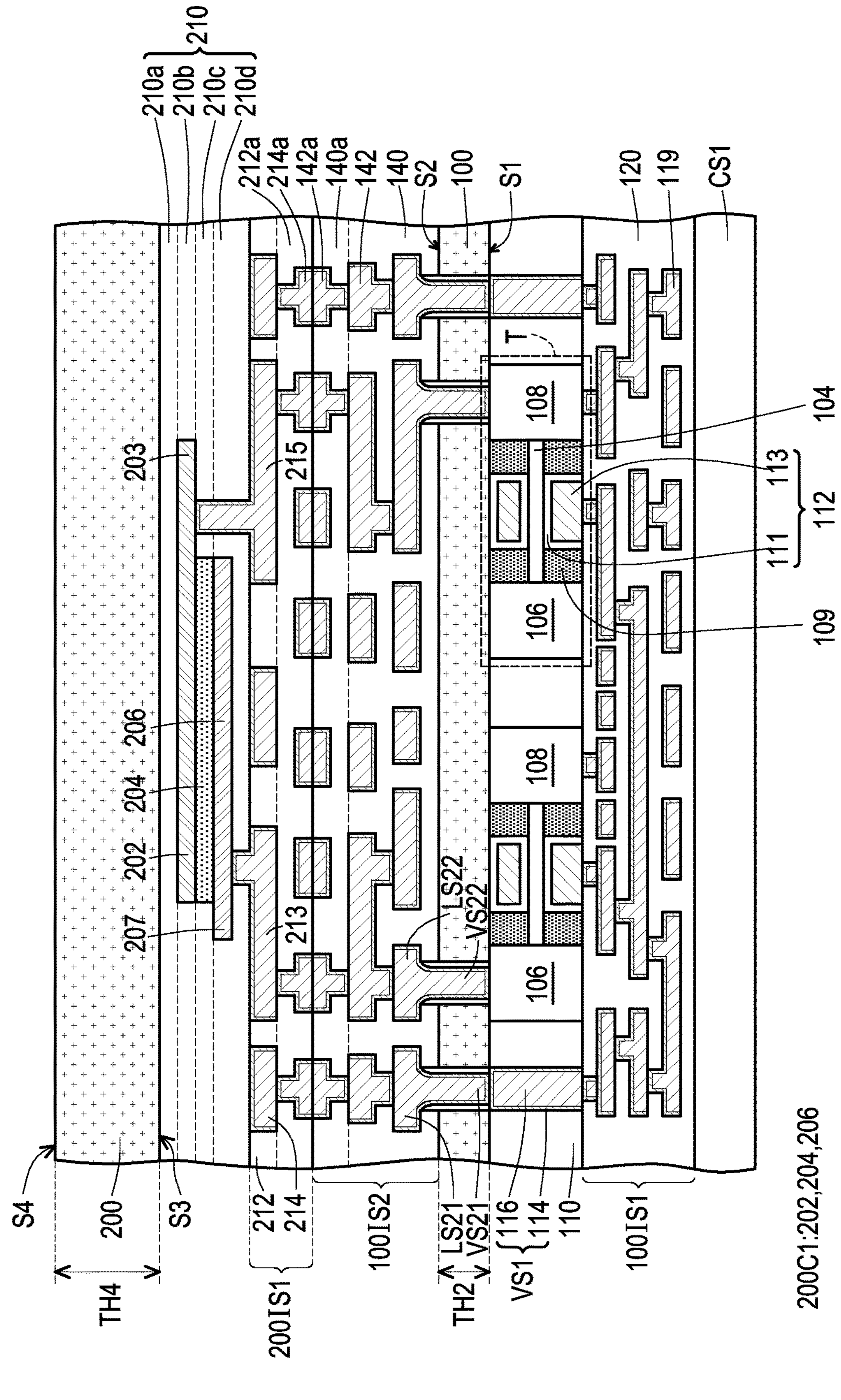
Figure 5C:
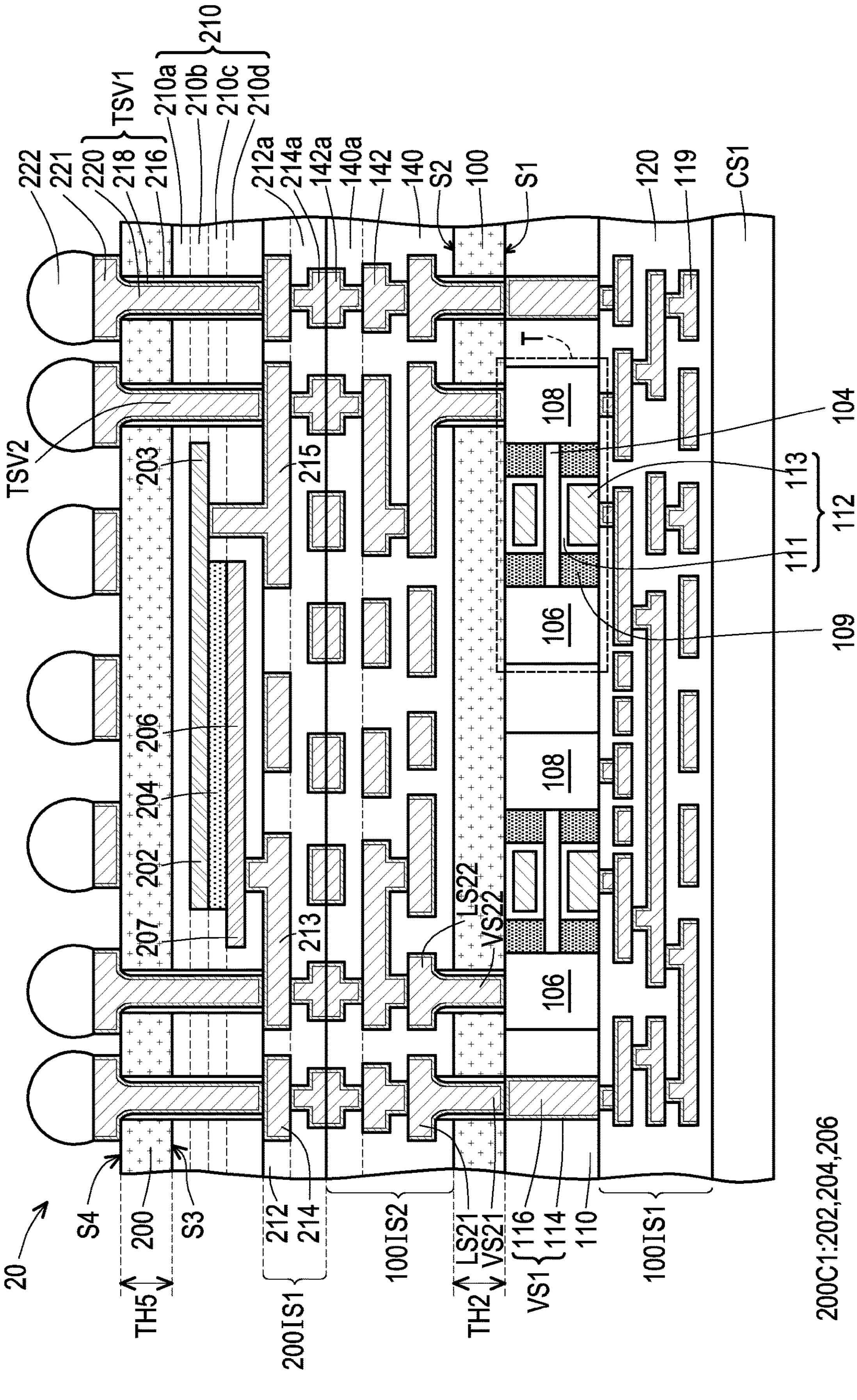

FIG. 5A to FIG. 5C illustrate cross-sectional views of a method of forming a semiconductor device in accordance with some embodiments of the present disclosure. It is understood that the disclosure is not limited by the method described below. Additional operations can be provided before, during, and/or after the method and some of the operations described below can be replaced or eliminated, for additional embodiments of the methods. Although FIG. 5A to FIG. 5C are described in relation to a method, it is appreciated that the structures disclosed in FIG. 5A to FIG. 5C are not limited to such a method, but instead may stand alone as structures independent of the method.

Referring to FIG. 5A, an operation similar to that described in FIG. 1A is performed, so as to form a transistor T at a first side S1 of the substrate 100 and a first dielectric layer 110 aside the transistor T. In some embodiments, the transistor T is a GAA transistor that includes a gate structure 112 surrounding nanowires 104 suspended by two strained regions 106 and 108.

Thereafter, an operation similar to that described in FIG. 1B is performed, so as to form a first metal via VS1 that penetrates through the first dielectric layer 110 and is located aside the transistor T.

Afterwards, an operation similar to that described in FIG. 1C is performed, so as to form a first interconnect structure 100IS1 over the first side S1 of the substrate 100 and electrically connected to the transistor T and the first metal via VS1.

Still referring to FIG. 5A, an operation similar to that described in FIG. 1D is performed, so as to thin the substrate 100 from a second side S2 opposite to the first side S1 of the substrate 100. In some embodiments, a first carrier CS1 is bonded to the first interconnect structure 100IS1 before the thinning operation. In some embodiments, after the thinning operation, the thickness TH2 of the thinned substrate 100 of FIG. 5A ranges from about 0.01 um to 0.1 um.

Thereafter, an operation similar to that described in FIG. 1F is performed, so as to form a second metal via VS21 that penetrates through the substrate 100 and is connected to the first metal via VS21. In some embodiments, during the formation of the second metal via VS21, a third metal via VS22 is simultaneously formed to penetrate through the substrate 100 and is electrically connected to one of the strained regions 106 and 108 of the transistor T.

Thereafter, an operation similar to that described in FIG. 1G is performed, so as to form a second interconnect structure 100IS2 over the second side S2 of the substrate 100 and electrically connected to the second metal via VS22.

The first difference between the structure of FIG. 5A and FIG. 1G lies in that the operation described in FIG. 1E of forming a capacitor is omitted in this embodiment. The materials, forming methods and element configurations of like elements of FIG. 5A are similar to the materials, forming methods and element configurations of like elements described in FIGS. 1A-1D and FIGS. 1F-1G, so the details are not iterated above.

The second difference between the structure of FIG. 5A and FIG. 1G lies in that the functions of the topmost features of the interconnect structure 100IS2. Specifically, the topmost features of the interconnect structure 100IS2 in FIG. 1G serve as UBM pads for ball mount. However, the topmost features of the interconnect structure 100IS2 in FIG. 5A serve as bonding features (e.g., bonding pads and/or bonding vias) for bonding to another substrate. In some embodiments, the interconnect structure 100IS2 may include dielectric layers 140 and metal features 142 embedded by the dielectric layers 140. In some embodiments, the topmost metal features 142 are embedded by the topmost dielectric layer 142*a*, and the top surfaces of the topmost metal features 142*a* are substantially flushed with the top surface of the topmost dielectric layer 142*a*. In some embodiments, the topmost metal features 142*a* and the topmost dielectric layer 142*a* are collectively referred to as a “first bonding structure”. The topmost metal features 142*a* are referred as “first bonding metal features” or “first bonding pads/vias” in some examples. The topmost dielectric layer 142*a* is referred to as a “first bonding dielectric layer” or “first bonding film” in some examples.

Referring to FIG. 5B, a substrate 200 including a capacitor 200C1 is provided. The substrate 200 may be a semiconductor substrate such as a silicon substrate. The substrate 200 is hundreds of micron-scale. In some embodiments, the substrate 200 has a thickness TH4 of greater than about 700 um. The substrate 200 has a first side S3 and a second side S4 opposite to the first side S3. In some embodiments, the first side S3 is a front side or an active side, and the second side S4 is a front side or an inactive side. However, the disclosure is not limited thereto. In other embodiments, the first side S3 is a back side, and the second side S4 is a front side. In some embodiments, the second substrate 200 is free of a transistor. In other embodiments, the second substrate 200 includes a transistor.

Thereafter, a capacitor 200C1 is formed over the first side S3 of the substrate 200 and embedded by dielectric layers 210. In some embodiments, the capacitor 200C1 is a planar metal-insulator-metal (MIM) capacitor including a bottom metal electrode 202, a top metal electrode 206 and a capacitor dielectric layer 204 formed between the bottom metal electrode 202 and the top metal electrode 206. The method of forming the capacitor 200C1 includes performing multiple depositing processes and patterning processes (e.g., photolithography and etching processes) alternatively. Accordingly, the bottom metal electrode 202, the capacitor dielectric layer 204 and the top metal electrode 206 are formed sequentially on the first side S3 of the substrate 200. The bottom metal electrode 202 is separated to the first side S3 of the substrate 200 by a dielectric layer 210*a* and embedded by a dielectric layer 210*b*. The capacitor dielectric layer 204 is disposed on the bottom metal electrode 202 and embedded by a dielectric layer 210*c*. The top metal electrode layer 206 is disposed on the capacitor dielectric layer 204 and embedded by a dielectric layer 210*d*. The dielectric layers 210*a* to 210*d* are collectively referred to as dielectric layers 210. Each of the bottom metal electrode 202 and the top metal electrode 206 may include a titanium (Ti) layer, a titanium nitride (TiN) layer, a tantalum (Ta) layer, a tantalum nitride (TaN) layer, the like, or a combination thereof. The capacitor dielectric layer 204 may include a nitride layer, a silicon nitride layer, or a high-k dielectric layer having a dielectric constant greater than 4. Exemplary high-k layer may include hafnium dioxide, hafnium silicate, zirconium silicate, zirconium dioxide, the like, or a combination thereof. The capacitor dielectric layer 204 may be a single-layer or a multi-layer structure. The thickness of each of the bottom metal electrode 202, a capacitor dielectric layer 204 and a top metal electrode 206 may range from about 0.05 um to 0.15 um. In some embodiments, the capacitance of the capacitor 200C1 ranges from about $10^{-6}$ F to $10^{-3}$ F. In some embodiments, the bottom metal electrode 202 has an extending portion 203 not covered by (or misaligned with) the top metal electrode 206 and the capacitor dielectric layer 204. In some embodiments, the top metal electrode 206 includes an extending portion 207 misaligned with the underlying the capacitor dielectric layer 204 and the bottom metal electrode 202. In some embodiments, one sidewall of the capacitor dielectric layer 204 is aligned with the sidewall of the bottom metal electrode 202, and the opposite sidewall of the capacitor dielectric layer 204 is aligned with the sidewall of the top metal electrode 206.

The dielectric layers 210 may include inter-metal dielectric (IMD) layers. The IMD layers may include silicon oxide, silicon oxynitride, silicon nitride, a low low-k material having a dielectric constant less than 3.5, the like, or a combination thereof. The dielectric layers 210 and the capacitor dielectric layer 204 may include different materials. The topmost dielectric layer 210*d* covers the top and sidewall of the top metal electrode layer 206.

Afterwards, a third interconnect structure 200IS1 is formed on the first side S3 of the substrate 200 and electrically connected to the capacitor 200C1. The interconnect structure 200IS1 may include metal features 214 embedded by dielectric layers 212. The metal features 214 are disposed in the dielectric layers 212 and electrically connected with each other. The dielectric layers 212 may include etch stop layers and inter-metal dielectric (IMD) layers with different materials. The etch stop layers may include silicon nitride, silicon oxynitride, silicon nitride with oxygen (O) or carbon (C) elements, metal oxide such as $Al_2O_3$, the like, or a combination thereof. The IMD layers may include silicon oxide, silicon oxynitride, silicon nitride, a low low-k material having a dielectric constant less than 3.5, the like, or a combination thereof. The metal features 214 include metal lines, metal vias and/or metal pads. The metal vias are formed between and in contact with two metal lines. The metal features 214 may include Cu, Al, Ti, Ta, W, Ru, Co, Ni, the like, or a combination thereof. In some embodiments, a metal liner layer may be disposed between each metal feature 214 and the dielectric layer 212 to prevent the material of the metal feature 214 from migrating to the underlying capacitor 200C1. In some embodiments, the metal liner layer includes a seed layer and/or a barrier layer. The seed layer may include Ti/Cu. The barrier layer may include Ta, TaN, Ti, TiN, CoW or a combination thereof. In some embodiments, the interconnect structure 200IS1 is formed by a dual damascene process. For example, a metal line and the underlying metal via may be formed as an integrated line and via structure without an interface by a dual damascene process. In some embodiments, the metal features 214 include a metal feature 213 electrically connected to the top metal electrode 206, and a metal feature 215 electrically connected to the bottom metal electrode 202. Specifically, the metal via of the metal feature 213 is landed on the top metal electrode 206, and the metal via of the metal feature 215 is landed on the extending portion 203 of the bottom metal electrode 202.

In some embodiments, the topmost metal features 214*a* are embedded by the topmost dielectric layer 212*a*, and the top surfaces of the topmost metal features 214*a* are substantially flushed with the top surface of the topmost dielectric layer 212*a*. In some embodiments, the topmost metal features 214*a* and the topmost dielectric layer 212*a* are collectively referred to as a "second bonding structure". The topmost metal features 214*a* are referred as "second bonding metal features" or "second bonding pads/vias" in some examples. The topmost dielectric layer 212*a* is referred to as a "second bonding dielectric layer" or "second bonding film" in some examples.

Still referring to FIG. 5B, the substrate 200 is turned over and then bonded to the substrate 100, with the interconnect structure 200IS1 facing the interconnect structure 100IS2. In some embodiments, the interconnect structure 200IS1 is bonded to the interconnect structure 100IS1 through a metal-to-metal bonding and a dielectric-to-dielectric bonding. For examples, the bonding metal features 214*a* of the interconnect structure 200IS1 are bonded to the bonding metal features 142*a* of the interconnect structure 100IS2, and the bonding dielectric layer 212*a* of the interconnect structure 200IS1 is bonded to the bonding dielectric layer 140*a* of the interconnect structure 100IS2. The bonding metal features 214*a* and 142*a* include active bonding features with both bonding and electrical connection functions, and dummy bonding features with bonding function but free of electrical connection function. The size of bonding metal features 214*a* may be the same or different from the size of the bonding metal features 142*a*. The central axis of bonding metal features 214*a* may be the aligned with or misaligned with the central axis of the bonding metal features 142*a*.

Referring to FIG. 5C, a thinning process is performed to the second side S4 of the substrate 200, so as to reduce the thickness of the substrate 200. In some embodiments, the thinning process is performed to the second side S4 of the substrate 200, so as to thin the substrate 200 to the desired thickness. In some embodiments, the thickness TH5 of the thinned substrate 200 ranges from about 5 um to 10 um. The thinning process may include a grinding process, a polishing process, the like or a combination thereof.

Thereafter, through substrate vias TSV1 are formed through the substrate 200 and the dielectric layers 210 and landed on the metal features 214 of the interconnect structure 200IS1. In some embodiments, via openings are formed through the substrate 200 and dielectric layer 210 by photolithography and etching processes. Thereafter, an insulator liner layer 216 is formed on the sidewalls and bottoms of the via openings. The insulator liner layer 216 may include silicon oxide, silicon oxynitride, or the like. An anisotropic etching process is then performed to remove the bottom portions the insulator liner, so the remaining insulator liner layer 216 is formed on the sidewalls of the via openings. In some embodiments, the top surface of the insulator liner layer 216 is substantially flushed with the second side S4 of the substrate 200, and the bottom surface of the insulator liner layer 216 is substantially flushed with the surface of the dielectric layer 210*d*.

In some embodiments, during the operation of forming through substrate vias TSV1, through substrate vias TSV2 are simultaneously formed through the substrate 200 and the dielectric layer 210 and landed on the metal features 213 and 215. Therefore, the through substrate vias TSV2 are electrically connected to the capacitor 200C1 and the underlying transistor T through the interconnect structures 200IS1 and 100IS2 therebetween. The element configuration of through substrate vias TSV2 is similar to the element configuration of through substrate vias TSV1.

In some embodiments, an under bump metallization (UBM) pads 221 and the underlying through substrate vias TSV1/TSV2 may be formed in the same process operation. For example, a metal liner layer 218 and a metal layer 220 are formed as an integrated pad and via structure without an interface by a dual damascene process. The metal liner layer 218 may include a seed layer and/or a barrier layer. The seed layer may include Ti/Cu. The barrier layer may include Ta, TaN, Ti, TiN, CoW or a combination thereof. The metal layer 220 may include Cu, Al, Ti, Ta, W, Ru, Co, Ni, the like, or a combination thereof. The metal liner layer 218, the metal layer 220 and the insulator liner layer 216 constitute the through substrate vias TSV1 in some examples. The under bump metallization (UBM) pads 221 and the through substrate vias TSV1/TSV2 may be formed in different process operations as needed.

Thereafter, conductive terminals or bumps 222 are formed over and electrically connected to the UBM pads 221. In some embodiments, the bumps 222 include solder bumps, and/or may include metal pillars (e.g., copper pillars), solder caps formed on metal pillars, and/or the like. The bumps 222 may be formed by a suitable process such as evaporation, electroplating, ball drop, or screen printing. A semiconductor device 20 of some embodiments is thus completed.

In the semiconductor device 20 of some embodiments, the capacitor 200C1 and the transistor T are disposed at opposite sides of a thin substrate 100 and connected to each other through vertical power rails (constituted by metal vias VS1 and VS21, interconnect structures 100IS2 and 200IS1 and through substrate vias TSV1), so as to significantly shorten the electrical path and routing, and greatly improve the power integrity of the semiconductor device.

The above embodiments in which the capacitor is a planar MIM capacitor are provided for illustration purposes, and are not construed as limiting the present disclosure. In other embodiments, the capacitor can be another type of capacitor, such as trench-type MIM capacitor as needed.

Figure 6A:
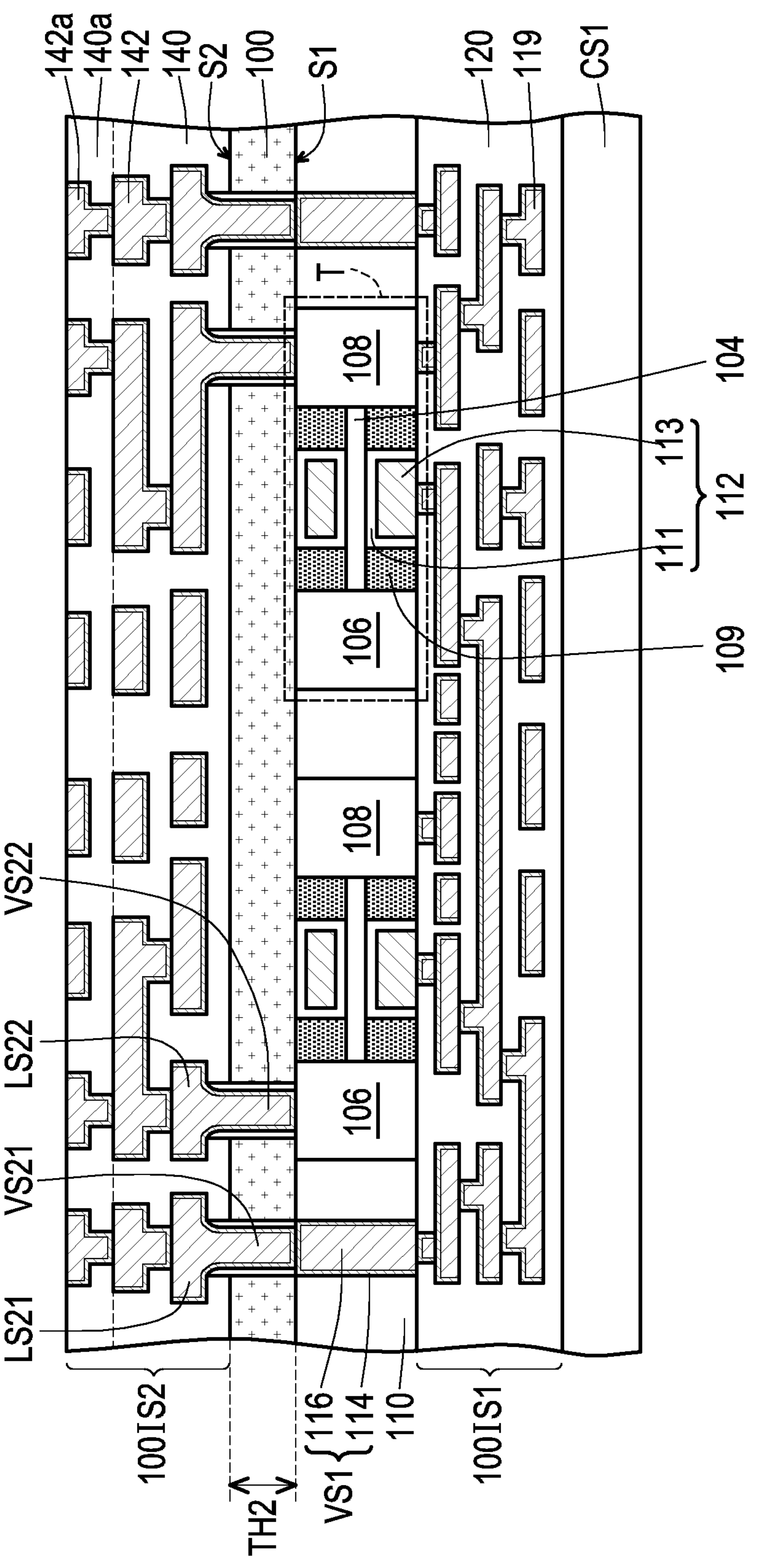
FIG. 6A to FIG. 6C illustrate cross-sectional views of a method of forming a semiconductor device in accordance with some embodiments of the present disclosure.
Figure 6B:
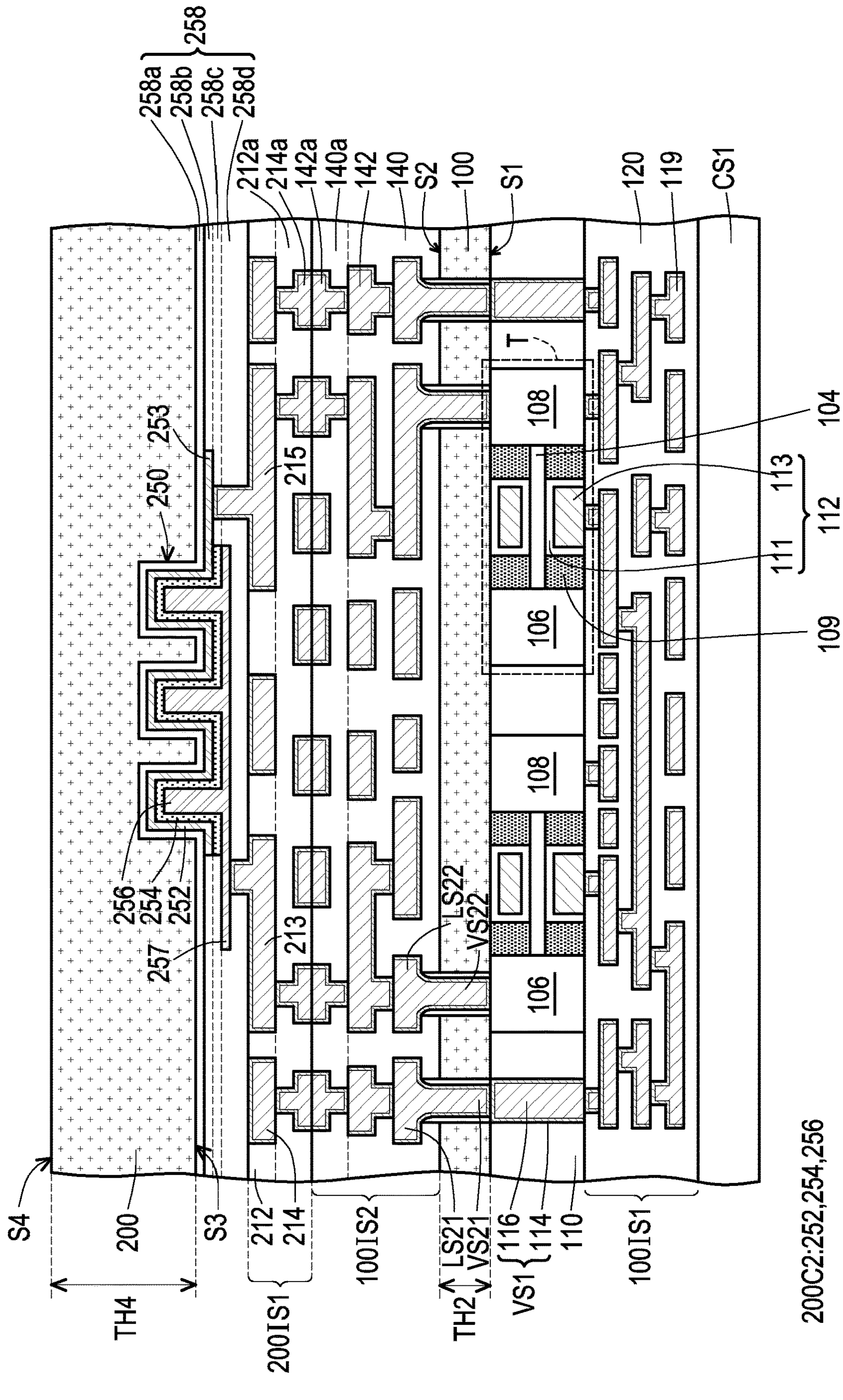
Figure 6C:
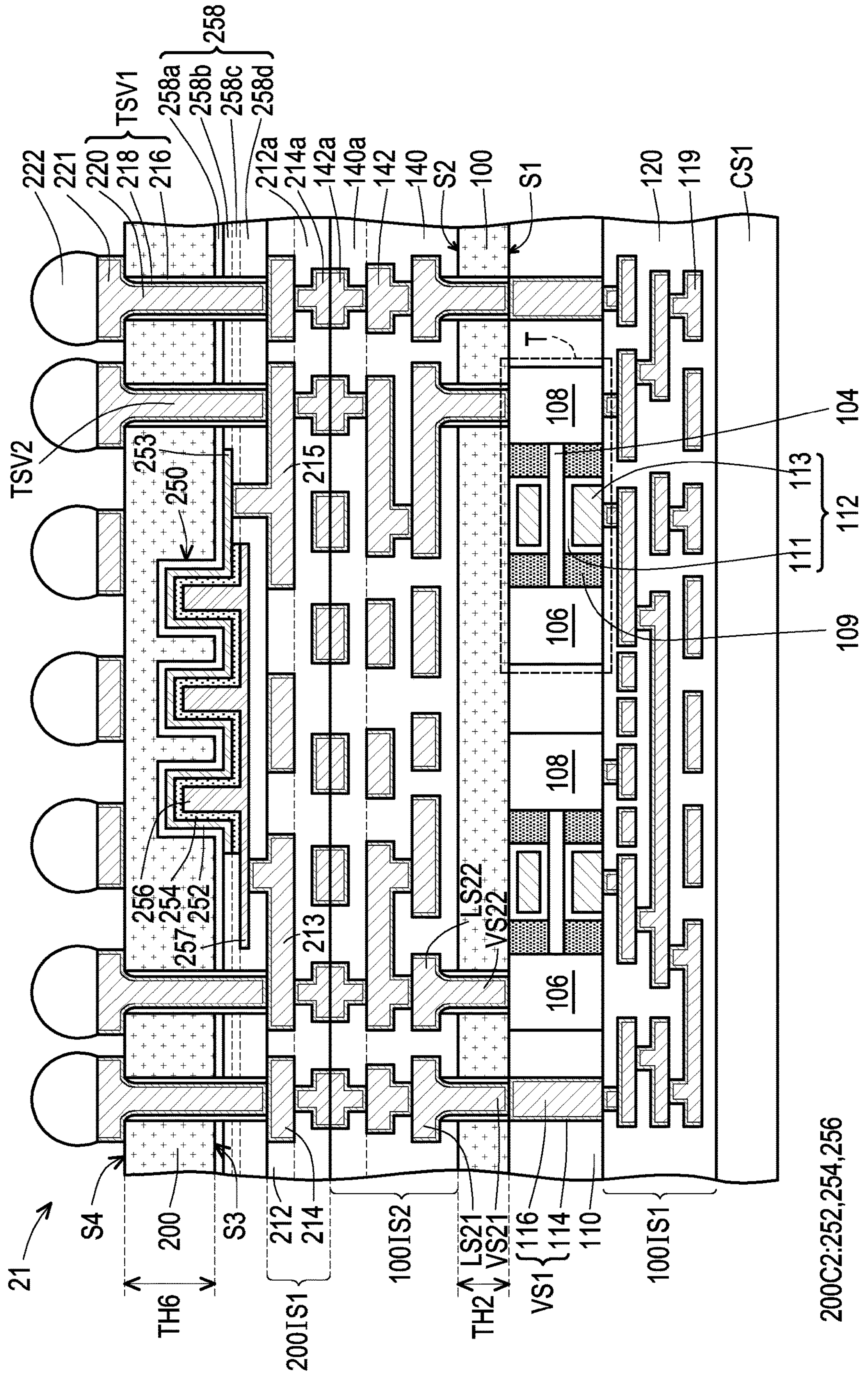

FIG. 6A to FIG. 6C illustrate cross-sectional views of a method of forming a semiconductor device in accordance with some embodiments of the present disclosure. The method of FIG. 6A to FIG. 6C is similar to the method of FIG. 5A to FIG. 5C, so the difference between them is described in details below and the similarity is not iterated herein.

Referring to FIG. 6A, a structure similar to the structure of FIG. 5A is provided.

Referring to FIG. 6B, a substrate 200 including a capacitor 200C2 is provided. The substrate 200 may be a semiconductor substrate such as a silicon substrate. The substrate 200 is hundreds of micron-scale. In some embodiments, the substrate 200 has a thickness TH4 of greater than about 700 um. The substrate 200 has a first side S3 and a second side S4 opposite to the first side S3. In some embodiments, the first side S3 is a front side or an active side, and the second side S4 is a front side or an inactive side. However, the disclosure is not limited thereto. In other embodiments, the first side S3 is a back side, and the second side S4 is a front side. In some embodiments, the second substrate 200 is free of a transistor. In other embodiments, the second substrate 200 includes a transistor.

Thereafter, a capacitor 200C2 is formed in the first side S3 of the substrate 200 and embedded by the substrate 200 and the dielectric layers 258. In some embodiments, the capacitor 200C2 is a trench-type metal-insulator-metal (MIM) capacitor including a bottom metal electrode 252, a top metal electrode 256 and a capacitor dielectric layer 254 formed between the bottom metal electrode 252 and the top metal electrode 256. In some embodiments, the capacitor 200C2 is embedded by the substrate 200 and the dielectric layers 258. Specifically, the capacitor 200C2 extends from the first side S3 towards the second side S4 of the substrate 200. The method of forming the capacitor 200C2 includes forming trenches 250 in the substrate 200, and performing multiple depositing processes and patterning processes (e.g., photolithography and etching processes) alternatively. Accordingly, the bottom metal electrode 252 and the capacitor dielectric layer 254 are formed conformally along the topography of the trenches 250, and the top metal electrode 256 is formed to fill the trenches 250. The bottom metal electrode 252 is separated to the first side S3 of the substrate 200 by a dielectric layer 258*a* and embedded by a dielectric layer 258*b*. The capacitor dielectric layer 254 is disposed on the bottom metal electrode 252 and embedded by a dielectric layer 258*c*. The top metal electrode layer 256 is disposed on the capacitor dielectric layer 254 and embedded by a dielectric layer 258*d*. The dielectric layers 258*a* to 258*d* are collectively referred to as dielectric layers 258. Each of the bottom metal electrode 252 and the top metal electrode 256 may include a titanium (Ti) layer, a titanium nitride (TiN) layer, a tantalum (Ta) layer, a tantalum nitride (TaN) layer, the like, or a combination thereof. The capacitor dielectric layer 254 may include a nitride layer, a silicon nitride layer, or a high-k dielectric layer having a dielectric constant greater than 4. Exemplary high-k layer may include hafnium dioxide, hafnium silicate, zirconium silicate, zirconium dioxide, the like, or a combination thereof. The capacitor dielectric layer 254 may be a single-layer or a multi-layer structure. The thickness of each of the bottom metal electrode 252, the capacitor dielectric layer 254 and the top metal electrode 256 may range from about 0.05 um to 0.15 um. In some embodiments, the capacitance of the capacitor 200C2 ranges from about $10^{-6}$ F to $10^{-3}$ F. In some embodiments, the bottom metal electrode 252 has an extending portion 253 not covered by (or misaligned with) the top metal electrode 256 and the capacitor dielectric layer 254. In some embodiments, the top metal electrode 256 includes an extending portion 257 misaligned with the underlying the capacitor dielectric layer 254 and the bottom metal electrode 252. In some embodiments, one sidewall of the capacitor dielectric layer 254 is aligned with the sidewall of the bottom metal electrode 252, and the opposite sidewall of the capacitor dielectric layer 254 is aligned with the sidewall of the top metal electrode 256.

The dielectric layers 258 may include inter-metal dielectric (IMD) layers. The IMD layers may include silicon oxide, silicon oxynitride, silicon nitride, a low low-k material having a dielectric constant less than 3.5, the like, or a combination thereof. The dielectric layers 258 and the capacitor dielectric layer 254 may include different materials. The topmost dielectric layer 258*d* covers the top and sidewall of the top metal electrode layer 256.

Afterwards, a third interconnect structure 200IS1 is formed on the first side S3 of the substrate 200 and electrically connected to the capacitor 200C2. The interconnect structure 200IS1 may include metal features 214 embedded by dielectric layers 212. The metal features 214 are disposed in the dielectric layers 212 and electrically connected with each other. The dielectric layers 212 may include etch stop layers and inter-metal dielectric (IMD) layers with different materials. The etch stop layers may include silicon nitride, silicon oxynitride, silicon nitride with oxygen (O) or carbon (C) elements, metal oxide such as $Al_2O_3$, the like, or a combination thereof. The IMD layers may include silicon oxide, silicon oxynitride, silicon nitride, a low low-k material having a dielectric constant less than 3.5, the like, or a combination thereof. The metal features 214 include metal lines, metal vias and/or metal pads. The metal vias are formed between and in contact with two metal lines. The metal features 214 may include Cu, Al, Ti, Ta, W, Ru, Co, Ni, the like, or a combination thereof. In some embodiments, a metal liner layer may be disposed between each metal feature 214 and the dielectric layer 212 to prevent the material of the metal feature 214 from migrating to the underlying capacitor 200C2. In some embodiments, the metal liner layer includes a seed layer and/or a barrier layer.

The seed layer may include Ti/Cu. The barrier layer may include Ta, TaN, Ti, TiN, CoW or a combination thereof. In some embodiments, the interconnect structure 200IS1 is formed by a dual damascene process. For example, a metal line and the underlying metal via may be formed as an integrated line and via structure without an interface by a dual damascene process. In some embodiments, the metal features 214 includes a metal feature 213 electrically connected to the top metal electrode 256, and a metal feature 215 electrically connected to the bottom metal electrode 252. Specifically, the metal via of the metal feature 213 is landed on the extending portion 257 of the top metal electrode 256, and the metal via of the metal feature 215 is landed on the extending portion 253 of the bottom metal electrode 252.

In some embodiments, the topmost metal features 214*a* are embedded by the topmost dielectric layer 212*a*, and the top surfaces of the topmost metal features 214*a* are substantially flushed with the top surface of the topmost dielectric layer 212*a*. In some embodiments, the topmost metal features 214*a* and the topmost dielectric layer 212*a* are collectively referred to as a "second bonding structure". The topmost metal features 214*a* are referred as "second bonding metal features" or "second bonding pads/vias" in some examples. The topmost dielectric layer 212*a* is referred to as a "second bonding dielectric layer" or "second bonding film" in some examples.

Still referring to FIG. 6B, the substrate 200 is turned over and then bonded to the substrate 100, with the interconnect structure 200IS1 facing the interconnect structure 100IS2. In some embodiments, the interconnect structure 200IS1 is bonded to the interconnect structure 100IS2 through a metal-to-metal bonding and a dielectric-to-dielectric bonding. For examples, the bonding metal features 214*a* of the interconnect structure 200IS1 are bonded to the bonding metal features 142*a* of the interconnect structure 100IS2, and the bonding dielectric layer 212*a* of the interconnect structure 200IS1 is bonded to the bonding dielectric layer 140*a* of the interconnect structure 100IS2. The bonding metal features 214*a* and 142*a* include active bonding features with both bonding and electrical connection functions, and dummy bonding features with bonding function but free of electrical connection function. The size of bonding metal features 214*a* may be the same or different from the size of the bonding metal features 142*a*. The central axis of bonding metal features 214*a* may be the aligned with or misaligned with the central axis of the bonding metal features 142*a*.

Referring to FIG. 6C, a thinning process is performed to the second side S4 of the substrate 200, so as to reduce the thickness of the substrate 200. In some embodiments, the thinning process is performed to the second side S4 of the substrate 200, so as to thin the substrate 200 to the desired thickness. In some embodiments, the thickness TH6 of the thinned substrate 200 ranges from about 5 um to 15 um. The thinning process may include a grinding process, a polishing process, the like or a combination thereof.

Thereafter, through substrate vias TSV1 are formed through the substrate 200 and the dielectric layers 258 and landed on the metal features 214 of the interconnect structure 200IS1. In some embodiments, via openings are formed through the substrate 200 and dielectric layer 258 by photolithography and etching processes. Thereafter, an insulator liner layer 216 is formed on the sidewalls and bottoms of the via openings. The insulator liner layer 216 may include silicon oxide, silicon oxynitride, or the like. An anisotropic etching process is then performed to remove the bottom portions the insulator liner, so the remaining insulator liner layer 216 is formed on the sidewalls of the via openings. In some embodiments, the top surface of the insulator liner layer 216 is substantially flushed with the second side S4 of the substrate 200, and the bottom surface of the insulator liner layer 216 is substantially flushed with the surface of the dielectric layer 258*d*.

In some embodiments, during the operation of forming through substrate vias TSV1, through substrate vias TSV2 are simultaneously formed through the substrate 200 and the dielectric layer 258 and landed on the metal features 213 and 215. Therefore, the through substrate vias TSV2 are electrically connected to the capacitor 200C2 and the underlying transistor T through the interconnect structures 200IS1 and 100IS2 therebetween. The element configuration of through substrate vias TSV2 is similar to the element configuration of through substrate vias TSV1.

In some embodiments, an under bump metallization (UBM) pads 221 and the underlying through substrate vias TSV1/TSV2 may be formed in the same process operation. For example, a metal liner layer 218 and a metal layer 220 are formed as an integrated pad and via structure without an interface by a dual damascene process. The metal liner layer 218 may include a seed layer and/or a barrier layer. The seed layer may include Ti/Cu. The barrier layer may include Ta, TaN, Ti, TiN, CoW or a combination thereof. The metal layer 220 may include Cu, Al, Ti, Ta, W, Ru, Co, Ni, the like, or a combination thereof. The metal liner layer 218, the metal layer 220 and the insulator liner layer 216 constitute the through substrate vias TSV1 in some examples. The under bump metallization (UBM) pads 221 and the through substrate vias TSV1/TSV2 may be formed in different process operations as needed.

Thereafter, conductive terminals or bumps 222 are formed over and electrically connected to the UBM pads 221. In some embodiments, the bumps 222 include solder bumps, and/or may include metal pillars (e.g., copper pillars), solder caps formed on metal pillars, and/or the like. The bumps 222 may be formed by a suitable process such as evaporation, electroplating, ball drop, or screen printing. A semiconductor device 21 of some embodiments is thus completed.

In the semiconductor device 21 of some embodiments, the capacitor 200C2 and the transistor T are disposed at opposite sides of a thin substrate 100 and connected to each other through vertical power rails (constituted by metal vias VS1 and VS21, interconnect structures 100IS2 and 200IS1 and through substrate vias TSV1), so as to significantly shorten the electrical path and routing, and greatly improve the power integrity of the semiconductor device.

In the above embodiments, a "TSV-last process" is performed to the structures of FIG. 5B and FIG. 6B. However, the present disclosure is not limited thereto. In other embodiments, a "TSV-first process" may be performed instead of the "TSV-last process". Specifically, the method may include: forming capacitors 200C1/200C2 at the first side S3 of the substrate 200; forming through substrate vias TSV1/TSV2 extending into the substrate 200; forming an interconnect structure 200IS1 electrically connected to the capacitors 200C1/200C2 and the through substrate vias TSV1/TSV2; bonding the second substrate 200 to the first substrate 100 with the interconnect structure 200IS1 and the interconnect structure 100IS2 facing each other; thinning the substrate 200 to expose the surfaces of the through substrate vias TSV1/TSV2; and forming bumps 222 on the through substrate vias TSV1/TSV2.

Figure 7A:
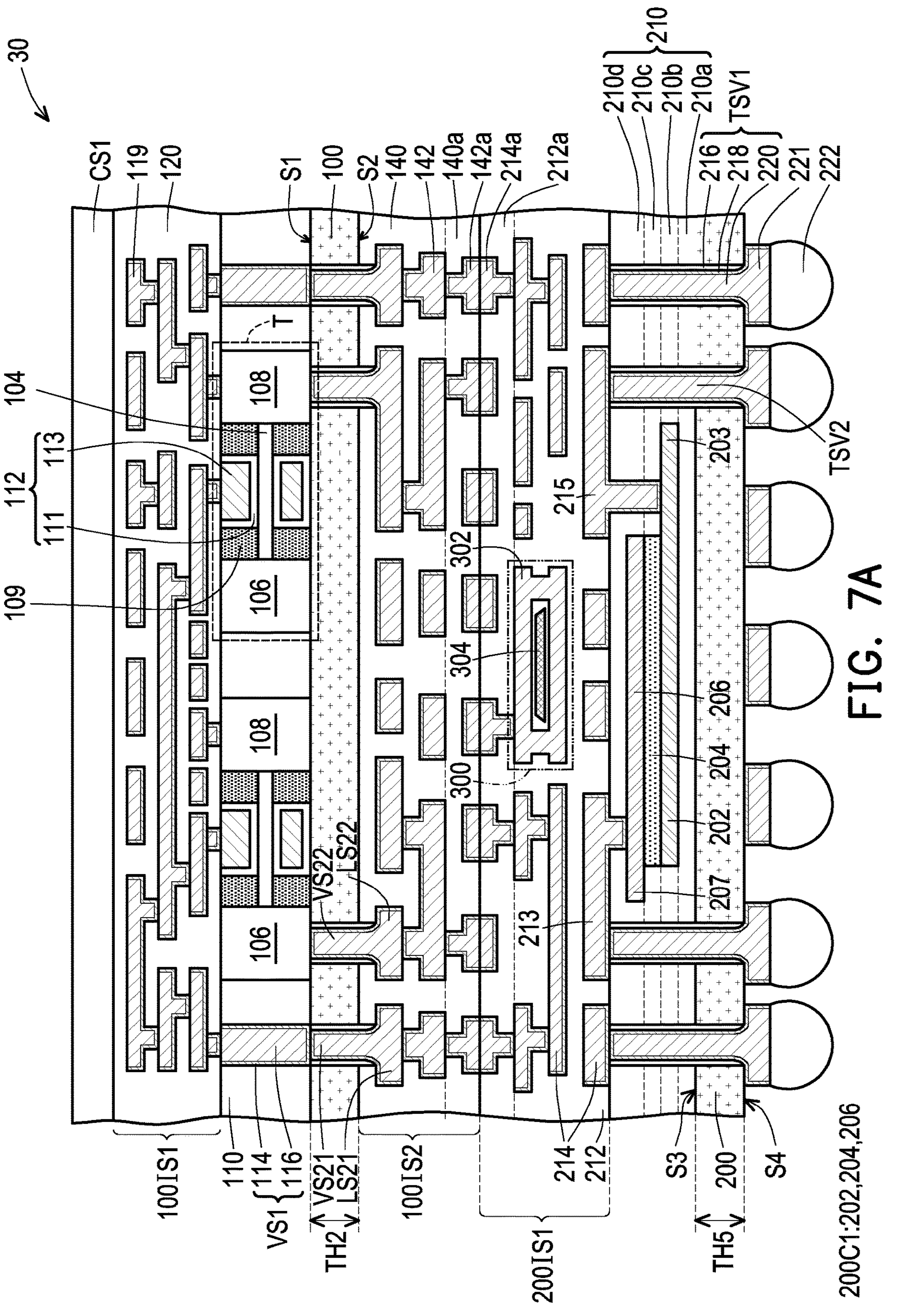
FIG. 7A and FIG. 7B illustrate cross-sectional views of semiconductor devices in accordance with some embodiments of the present disclosure.
Figure 7B:
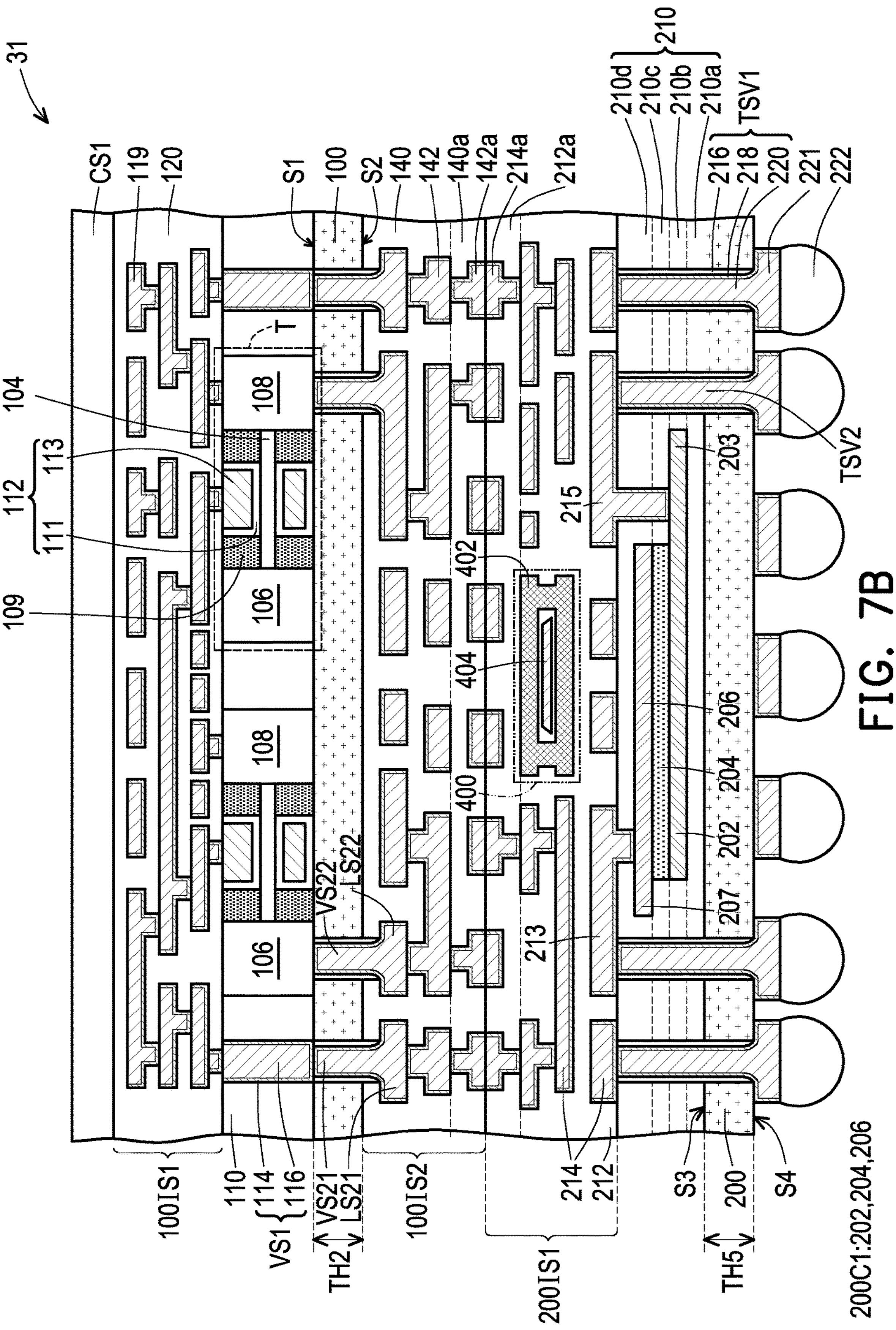

FIG. 7A and FIG. 7B illustrate cross-sectional views of semiconductor devices in accordance with some embodiments of the present disclosure.

The semiconductor device 30 of FIG. 7A is similar to the semiconductor device 20 of FIG. 5C, so the difference between them is described in details below and the similarity is not iterated herein. In the semiconductor device 30 of FIG. 7A, an inductor 300 is further included between the capacitor 200C1 and the bonding structure (including metal features 214*a* and the dielectric layer 212*a*). In some embodiments, the inductor 300 includes a magnetic core 304 surrounded by a metal winding 302. The magnetic core 304 may include Cobalt Zirconium Tantalum (CoZrTa; CZT), NiFe, the like, or a combination thereof. In some embodiments, the metal winding 302 turns around in a spiral manner on the outside of the magnetic core 304. In some embodiments, the metal winding 302 is electrically connected to a metal feature of the interconnect structure 200IS1. In some embodiments, the metal winding 302 and some metal features of the interconnect structure 200IS1 aside the metal winding 302 are formed simultaneously. In other embodiments, the metal winding 302 and some metal features of the interconnect structure 200IS1 aside the metal winding 302 are formed separately.

The semiconductor device 31 of FIG. 7B is similar to the semiconductor device 20 of FIG. 5C, so the difference between them is described in details below and the similarity is not iterated herein. In the semiconductor device 31 of FIG. 7B, an inductor 400 is further included between the capacitor 200C1 and the bonding structure (including metal features 214*a* and the dielectric layer 212*a*). In some embodiments, the inductor 400 includes a metal core 404 surrounded by a magnetic winding 402. The magnetic winding 402 may include Cobalt Zirconium Tantalum (CoZrTa; CZT), NiFe, the like, or a combination thereof. In some embodiments, the magnetic winding 402 turns around in a spiral manner on the outside of the metal core 404. In some embodiments, the metal core 404 is electrically connected to a metal feature (not shown in this cross section) of the interconnect structure 200IS1. In some embodiments, the magnetic winding 402 and some metal features of the interconnect structure 200IS1 aside the magnetic winding 402 are formed separately.

In some embodiments, a semiconductor device 11/12/13/14/15/16/17/18 includes a transistor T disposed at a first side S1 of the substrate 100, a first dielectric layer 110 disposed at the first side S1 of the substrate 100 and aside the transistor T; a first metal via VS1 penetrating through the first dielectric layer 110 and located aside the transistor T; a first interconnect structure 100IS1 disposed over the first side S1 of the substrate 100 and electrically connected to the transistor T and the first metal via VS1; a capacitor 100C1/100C2 located at a second side S2 of the substrate 100 opposite to the first side S1; a second dielectric layer 118/152 disposed aside the capacitor 100C1/100C2; a second metal via VS21 penetrating through the second dielectric layer 118/152 and the substrate 100 and landed on the first metal via VS1; and a second interconnect structure 100IS2 disposed over the second side S2 of the substrate 100 and electrically connected to the capacitor 100C1/100C2 and the second metal via VS21.

In some embodiments, the capacitor 100C is a planar MIM capacitor and completely embedded by the second dielectric layer 118, and a sidewall of one of two electrodes 122 and 126 of the planar MIM capacitor is connected to the second metal via VS21. In some embodiments, the capacitor 100C2 is a trench-type MIM capacitor and embedded by the second dielectric layer 152 and the substrate 100, and a sidewall of one of two electrodes 154 and 158 of the trench-type MIM capacitor is connected to the second metal via VS21. Other capacitors such as a DRAM stacked capacitor may be applicable.

In some embodiments, the semiconductor device 11/12/13/14/15/16/17/18 further includes a third metal via VS22 penetrating through the second dielectric layer 118/152 and the substrate 100 and landed on one of strained regions 106/108 of the transistor T.

In some embodiments, the semiconductor device 11/12/15/16 further includes a carrier CS1 bonded to the first interconnect structure 100IS1, and bumps 144 bonded to the second interconnect structure 100IS2.

In some embodiments, the semiconductor device 13/14/17/18 further includes a carrier CS2 bonded to the second interconnect structure 100IS2, and bumps 146 bonded to the first interconnect structure 100IS1.

In some embodiments, a semiconductor device 20/21/30/31 includes: a transistor T disposed at a first side S1 of a first substrate 100; a first interconnect structure 100IS2 disposed over the second side S2 of the first substrate 100 and electrically connected to the transistor T; a capacitor 200C1/200C2 is disposed at a first side S3 of a second substrate 200; and a second interconnect structure 200IS1 disposed over the capacitor 200C1/200C2 of the second substrate 200, wherein the first interconnect structure 100IS2 and the second interconnect structure 200IS1 are bonded to each other through a metal-to-metal bonding and a dielectric-to-dielectric bonding.

In some embodiments, the capacitor 200C1 is a planar MIM capacitor, and the electrodes 202 and 204 of the capacitor 200C1 are respectively connected to the metal features 213 and 215 of the second interconnect structure 200IS1. In some embodiments, the capacitor 200C2 is a trench-type MIM capacitor, and the electrodes 252 and 256 of the capacitor 200C2 are respectively connected to the metal features 213 and 215 of the second interconnect structure 200IS1. Other capacitors such as a DRAM stacked capacitor may be applicable.

In some embodiments, the semiconductor device 20/21 further includes bumps 222 on the second side S4 of the second substrate 200. In some embodiments, the semiconductor device 20/21 further includes a carrier CS1 bonded to the first interconnect structure 100IS1.

In some embodiments, an inductor 300/400 is further included in the semiconductor device 30/31 and is disposed between the capacitor 200C1 and the bonding features of the second interconnect structure 200IS1.

In some embodiments, the first side S1 of the first substrate 100 is a front side, and the first side S3 of the second substrate 200 is a front side, so the bonding is a face-to-face (F2F) bonding. However, the disclosure is not limited thereto. In other embodiments, the first side S1 of the first substrate 100 is a front side, and the first side S3 of the second substrate 200 is a back side, so the bonding is a face-to-back (F2B) bonding. Other back-to-back bonding and back-to-face bonding may be possible in other embodiments, as long as the thicknesses of substrates are thin enough and the routing paths of wirings are decreased.

In the above embodiments, the transistor is a GAA transistor. However, the disclosure is not limited thereto. The transistor may be a FinFET transistor or a planar transistor.

According to an aspect of the present disclosure, a method of forming a semiconductor device is provided. A transistor is formed at a first side of the substrate and a first dielectric layer is formed aside the transistor. A first metal via is formed through the first dielectric layer and aside the transistor. A first interconnect structure is formed over the first side of the substrate and electrically connected to the transistor and the first metal via. The substrate is thinned from a second side opposite to the first side of the substrate. A capacitor is formed at the second side of the substrate and a second dielectric layer is formed aside the capacitor. A second metal via is formed through the second dielectric layer and the substrate and electrically connected to the first metal via.

According to an aspect of the present disclosure, a method of forming a semiconductor device is provided. A transistor is formed at a first side of the first substrate and a first dielectric layer is formed aside the transistor. A first metal via is formed through the first dielectric layer and aside the transistor. A first interconnect structure is formed over the first side of the first substrate and electrically connected to the transistor and the first metal via. The first substrate is thinned from a second side opposite to the first side of the first substrate. A second metal via is formed through the first substrate and is connected to the first metal via. A second interconnect structure is formed over the second side of the first substrate and electrically connected the second metal via. A second substrate is provided with a capacitor at a first side of the second substrate. The second substrate is bonded to the first substrate with the capacitor and the second interconnect structure facing each other.

According to an aspect of the present disclosure, a semiconductor device includes: a transistor disposed at a first side of a substrate; a first dielectric layer disposed at the first side of the substrate and aside the transistor; a first metal via penetrating through the first dielectric layer and located aside the transistor; a first interconnect structure disposed over the first side of the substrate and electrically connected to the transistor and the first metal via; a capacitor located at a second side of the substrate opposite to the first side; a second dielectric layer disposed aside the capacitor; a second metal via penetrating through the second dielectric layer and the substrate and landed on the first metal via; and a second interconnect structure disposed over the second side of the substrate and electrically connected to the capacitor and the second metal via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

forming a transistor at a first side of a substrate and a first dielectric layer aside the transistor;

forming a first metal via through the first dielectric layer and aside the transistor;

forming a first interconnect structure over the first side of the substrate and electrically connected to the transistor and the first metal via;

thinning the substrate from a second side opposite to the first side of the substrate;

forming a capacitor and a second dielectric layer over a semiconductor substrate, wherein the capacitor is covered by the second dielectric layer; and disposing the semiconductor substrate over the second side of the substrate after the forming of the capacitor and the second dielectric layer over the semiconductor substrate, wherein the capacitor is disposed between the semiconductor substrate and the second side of the substrate.

2. The method of claim 1, wherein the transistor is a GAA transistor that comprises a gate structure surrounding nanowires suspended by two strained regions.

3. The method of claim 2, further comprising:

forming a second interconnect structure over the semiconductor substrate to be electrically connected to the capacitor, wherein after the disposing of the semiconductor substrate over the second side of the substrate, the second interconnect structure is disposed between the capacitor and the second side of the substrate.

4. The method of claim 3, further comprising:

forming a third interconnect structure over the second side of the substrate; and the disposing of the semiconductor substrate over the second side of the substrate comprising:

bonding the second interconnect structure to the third interconnect structure.

5. The method of claim 1, further comprising:

thinning the semiconductor substrate after the disposing of the semiconductor substrate over the second side of the substrate; and forming a second metal via through the semiconductor substrate after the thinning of the semiconductor substrate.

6. The method of claim 1, further comprising, bonding a first carrier to the first interconnect structure, before thinning the substrate.

7. The method of claim 6, further comprising, bonding a second carrier to the second interconnect structure;

removing the first carrier from the first interconnect structure; and forming bumps over the first interconnect structure.

8. The method of claim 1, wherein the capacitor is a planar MIM capacitor, and a sidewall of one of first and second electrodes of the planar MIM capacitor is connected to the second metal via.

9. The method of claim 8, wherein a thickness of the thinned substrate ranges from about 0.01 um to 0.1 um.

10. The method of claim 1, wherein the capacitor is a trench-type MIM capacitor, and a sidewall of one of first and second electrodes of the trench-type MIM capacitor is connected to the second metal via.

11. The method of claim 10, wherein a thickness of the thinned substrate ranges from about 5 μm to 15 μm.

12. A method of forming a semiconductor device, comprising:

forming a transistor at a first side of a first substrate and a first dielectric layer aside the transistor;

forming a first metal via through the first dielectric layer and aside the transistor;

forming a first interconnect structure over the first side of the first substrate and electrically connected to the transistor and the first metal via;

thinning the first substrate from a second side opposite to the first side of the first substrate;

forming a second metal via through the first substrate, wherein the second metal via is connected to the first metal via;

forming a second interconnect structure over the second side of the first substrate and electrically connected the second metal via;

providing a second substrate comprising a capacitor at a first side of the second substrate;

bonding a second substrate to the first substrate with the capacitor and the second interconnect structure facing each other; and forming a third interconnect structure over the first side of the first substrate to electrically connect to the capacitor, wherein the third interconnect structure is bonded to the second interconnect structure through a metal-to-metal bonding and a dielectric-to-dielectric bonding.

13. The method of claim 12, wherein the capacitor is a MIM capacitor, and first and second electrodes of the MIM capacitor are respectively connected to first and second metal features of the second interconnect structure.

14. The method of claim 13, further comprising forming through substrate vias that penetrate through the second substrate and landed on metal features of the second interconnect structure.

15. The method of claim 12, wherein the providing of the second substrate comprising the capacitor at the first side of the second substrate comprises:

performing a depositing process and a patterning process to form the capacitor over the second substrate, wherein the second substrate is a semiconductor substrate.

16. The method of claim 12, wherein the transistor is a GAA transistor comprising a gate surrounding nanowires suspended by two strained regions.

17. The method of claim 16, further comprising, during forming the second metal via, forming a third metal via that penetrates through the first substrate and is connected to one of the strained regions of the transistor.

18. A method of forming a semiconductor device, comprising:

forming a transistor at a first side of a first substrate and a first dielectric layer aside the transistor;

forming a first interconnect structure over the first side of the first substrate and electrically connected to the transistor;

forming a second interconnect structure over a second side of the first substrate and electrically connected the first interconnect structure;

providing a second substrate comprising a capacitor and a third interconnect structure over the capacitor; and bonding the third interconnect structure to the second interconnect structure after the providing of the second substrate comprising the capacitor and the third interconnect structure over the capacitor, wherein the third interconnect structure is disposed between the capacitor and the second interconnect structure.

19. The method of claim 18, further comprising, forming a first metal via through the first dielectric layer and aside the transistor; and forming a second metal via through the first substrate from a second side opposite to the first side, wherein the second metal via is connected to the first metal via.

20. The method of claim 18, further comprising forming through substrate vias that penetrate through the second substrate and landed on metal features of the third interconnect structure.

* * * * *